United States Patent
Jiang et al.

(10) Patent No.: US 12,501,700 B2
(45) Date of Patent: Dec. 16, 2025

(54) INTEGRATED CIRCUIT, SEMICONDUCTOR DEVICE HAVING STOP SEGMENT IN CONNECTION REGION BETWEEN LOGIC REGION AND MEMORY CELL REGION

(71) Applicant: Taiwan Semiconductor Manufacturing Company, Ltd., Hsinchu (TW)

(72) Inventors: Yu-Wei Jiang, Hsinchu (TW); Chieh-Fang Chen, Hsinchu County (TW); Yen-Chung Ho, Hsinchu (TW); Pin-Cheng Hsu, Hsinchu County (TW); Feng-Cheng Yang, Hsinchu County (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 424 days.

(21) Appl. No.: 18/152,154

(22) Filed: Jan. 10, 2023

(65) Prior Publication Data
US 2024/0096712 A1    Mar. 21, 2024

Related U.S. Application Data

(60) Provisional application No. 63/407,717, filed on Sep. 18, 2022.

(51) Int. Cl.
*H10D 86/01* (2025.01)
*H01L 23/522* (2006.01)
*H10D 87/00* (2025.01)

(52) U.S. Cl.
CPC ......... *H10D 86/01* (2025.01); *H01L 23/5226* (2013.01); *H10D 87/00* (2025.01)

(58) Field of Classification Search
CPC ...... H10D 86/01; H10D 87/00; H10D 64/689; H10D 86/423; H10D 86/451; H10D 86/60; H10D 86/411; H01L 23/5226
See application file for complete search history.

(56) References Cited

U.S. PATENT DOCUMENTS

| | | | | |
|---|---|---|---|---|
| 10,153,351 | B2* | 12/2018 | Hsu | H01L 21/76832 |
| 10,269,807 | B2* | 4/2019 | Hsu | H10B 12/0335 |
| 2017/0222008 | A1* | 8/2017 | Hsu | H01L 21/76889 |
| 2019/0027406 | A1* | 1/2019 | Chu | H01L 21/76885 |
| 2021/0375665 | A1* | 12/2021 | Cheng | H01L 21/76814 |
| 2021/0376151 | A1* | 12/2021 | Van Dal | H10D 87/00 |

* cited by examiner

*Primary Examiner* — Caleb E Henry
(74) *Attorney, Agent, or Firm* — JCIPRNET

(57) ABSTRACT

Provided is a semiconductor device includes a gate electrode, a gate dielectric layer, a channel layer, an insulating layer, a first source/drain electrode and a second source/drain electrode, a second dielectric layer, and a stop segment. The gate electrode is located within a first dielectric layer that overlies a substrate. The gate dielectric layer is located over the gate electrode. The channel layer is located on the gate dielectric layer. The insulating layer is located over the channel layer. The first source/drain electrode and the second source/drain electrode are located in the insulating layer, and connected to the channel layer. The second dielectric layer is beside one of the first source/drain electrode and the second source/drain electrode. The stop segment is embedded in the second dielectric layer.

20 Claims, 21 Drawing Sheets

INTEGRATED CIRCUIT, SEMICONDUCTOR DEVICE HAVING STOP SEGMENT IN CONNECTION REGION BETWEEN LOGIC REGION AND MEMORY CELL REGION

CROSS-REFERENCE TO RELATED APPLICATION

This application claims the priority benefit of U.S. provisional application Ser. No. 63/407,717, filed on Sep. 18, 2022. The entirety of the above-mentioned patent application is hereby incorporated by reference herein and made a part of this specification.

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
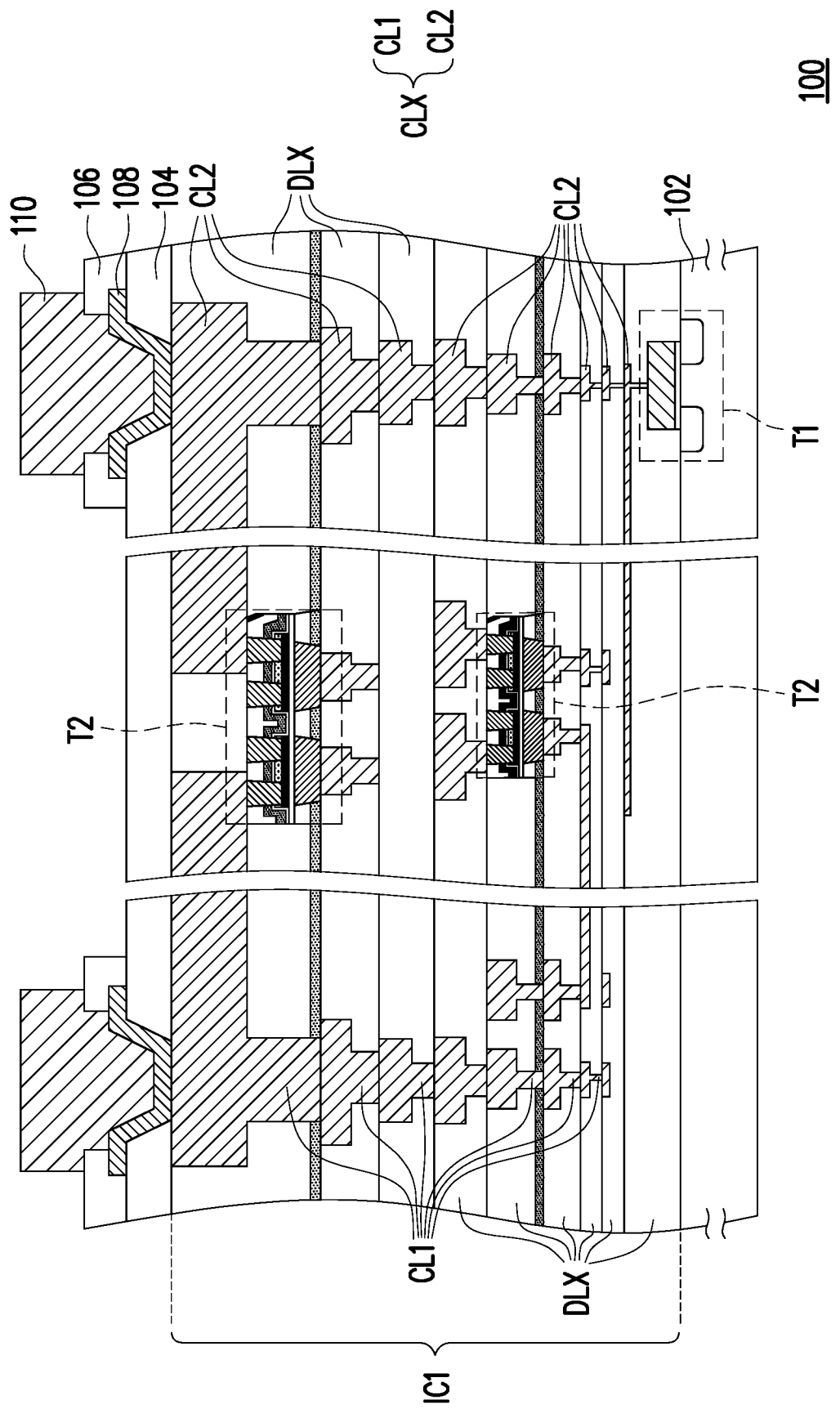
FIG. 1 is a schematic cross-sectional view of an integrated circuit in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic cross-sectional view of an integrated circuit 100 in accordance with some embodiments of the disclosure. In some embodiments, the integrated circuit 100 includes a substrate 102, an interconnection layer IC1, a passivation layer 104, a post-passivation layer 106, a plurality of conductive pads 108, and a plurality of conductive terminals 110. In some embodiments, the substrate 102 is made of elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. The substrate 102 may be a bulk silicon substrate, a silicon-on-insulator (SOI) substrate, or a germanium-on-insulator (GOI) substrate.

In some embodiments, the substrate 102 includes various doped regions depending on circuit requirements (e.g., p-type semiconductor substrate or n-type semiconductor substrate). In some embodiments, the doped regions are doped with p-type or n-type dopants. For example, the doped regions may be doped with p-type dopants, such as boron or $BF_2$; n-type dopants, such as phosphorus or arsenic; and/or combinations thereof. In some embodiments, these doped regions serve as source/drain electrode regions of a transistor T1, which is formed over the substrate 102. Depending on the types of the dopants in the doped regions, the transistor T1 may be referred to as n-type transistor or p-type transistor. In some embodiments, the transistor T1 further includes a metal gate and a channel under the metal gate. The channel is located between the source region and the drain region to serve as a path for electron to travel when the transistor T1 is turned on. On the other hand, the metal gate is located above the substrate 102 and is embedded in the interconnection layer IC1. In some embodiments, the transistor T1 is formed using suitable Front-end-of-line (FEOL) process. For simplicity, one transistor T1 is shown in FIG. 1. However, it should be understood that more than one transistor T1 may be presented depending on the application of the integrated circuit 100. When multiple transistors T1 are presented, these transistors T1 may be separated by shallow trench isolation (STI; not shown) located between two adjacent transistors T1.

As shown in FIG. 1, the interconnection layer IC1 is disposed on the substrate 102. In some embodiments, the interconnection layer IC1 includes a plurality of conductive layers CLX and a plurality of dielectric layers DLX alternately stacked up along a build-up direction. The interconnection layer IC1 further includes a plurality of transistors T2 located in between the plurality of dielectric layers DLX.

As illustrated in FIG. 1, the conductive layers CLX includes conductive vias CL1 and conductive patterns CL2 embedded in the dielectric layers DLX. In some embodiments, the conductive patterns CL2 located at different level heights are connected to one another through the conductive vias CL1. In other words, the conductive patterns CL2 are electrically connected to one another through the conductive vias CL1. In some embodiments, the bottommost conductive vias CL1 are connected to the transistor T1. For example, the bottommost conductive vias CL1 are connected to the metal gate, which is embedded in the bottommost dielectric layer DLX, of the transistor T1. In other words, the bottommost conductive vias CL1 establish electrical connection between the transistor T1 and the conductive patterns CL2 of the interconnection layer IC1. As illustrated in FIG. 1, the bottommost conductive via CL1 is connected to the metal gate of the transistor T1. It should be noted that in some alternative cross-sectional views, other bottommost conductive vias CL1 are also connected to source/drain electrode regions of the transistor T1. That is, in some embodiments, the bottommost conductive vias CL1 may be referred to as "contact structures" of the transistor T1.

In some embodiments, the dielectric layers DLX include materials such as polyimide, epoxy resin, acrylic resin, phenol resin, benzocyclobutene (BCB), polybenzooxazole (PBO), or any other suitable polymer-based dielectric material. Alternatively, the dielectric layers DLX may be formed of oxides or nitrides, such as silicon oxide, silicon nitride, or the like. The dielectric layers DLX may be formed by suitable fabrication techniques such as spin-on coating, chemical vapor deposition (CVD), plasma-enhanced chemical vapor deposition (PECVD), or the like.

In some embodiments, the conductive layers CLX include materials such as aluminum, titanium, copper, nickel, tungsten, or alloys thereof. The conductive layers CLX (including conductive patterns CL2 and the conductive vias CL1) may be formed by electroplating, deposition, and/or photolithography and etching. In some embodiments, the conductive patterns CL2 and the underlying conductive vias CL1 are formed simultaneously. It should be noted that the number of the dielectric layers DLX, the number of the conductive layers CLX illustrated in FIG. 1 are merely for illustrative purposes, and the disclosure is not limited thereto. In some alternative embodiments, fewer or more layers of the dielectric layers DLX and the conductive layers CLX may be formed depending on the circuit design.

In some embodiments, the transistors T2 are embedded in the interconnection layer IC1. For example, each transistor T2 is embedded in one of the dielectric layers DLX. In some embodiments, the transistors T2 are electrically connected to the conductive patterns CL2 through the corresponding conductive vias CL1. In some embodiments, the transistors T2 may be arranged in an array (e.g. array of transistors/array of memory cells) in each of the dielectric layers DLX. The formation method and the structure of the transistors T2 will be described in detail later.

As illustrated in FIG. 1, the passivation layer 104, the conductive pads 108, the post-passivation layer 106, and the conductive terminals 110 are sequentially formed on the interconnection layer IC1. In some embodiments, the passivation layer 104 is disposed on the topmost dielectric layer DLX and the topmost conductive layer CLX (conductive pattern CL2). In some embodiments, the passivation layer 104 has a plurality of openings partially exposing the topmost conductive patterns CL2. In some embodiments, the passivation layer 104 is a silicon oxide layer, a silicon nitride layer, a silicon oxy-nitride layer, or a dielectric layer formed by other suitable dielectric materials. The passivation layer 104 may be formed by suitable fabrication techniques such as (high-density plasma chemical vapor deposition) HDP-CVD, PECVD, or the like.

In some embodiments, the conductive pads 108 are formed over the passivation layer 104. In some embodiments, the conductive pads 108 extend into the openings of the passivation layer 104 to be in direct contact with the topmost conductive patterns CL2. That is, the conductive pads 108 are electrically connected to the interconnection layer IC1. In some embodiments, the conductive pads 108 include aluminum pads, copper pads, titanium pads, nickel pads, tungsten pads, or other suitable metal pads. The conductive pads 108 may be formed by, for example, electroplating, deposition, and/or photolithography and etching. It should be noted that the number and the shape of the conductive pads 108 illustrated in FIG. 1 are merely for illustrative purposes, and the disclosure is not limited thereto. In some alternative embodiments, the number and the shape of the conductive pads 108 may be adjusted based on demand.

In some embodiments, the post-passivation layer 106 is formed over the passivation layer 104 and the conductive pads 108. In some embodiments, the post-passivation layer 106 is formed on the conductive pads 108 to protect the conductive pads 108. In some embodiments, the post-passivation layer 106 has a plurality of contact openings partially exposing each conductive pad 108. The post-passivation layer 106 may be a polyimide layer, a PBO layer, or a dielectric layer formed by other suitable polymers. In some embodiments, the post-passivation layer 106 is formed by suitable fabrication techniques such as HDP-CVD, PECVD, or the like.

As illustrated in FIG. 1, the conductive terminals 110 are formed over the post-passivation layer 106 and the conductive pads 108. In some embodiments, the conductive terminals 110 extend into the contact openings of the post-passivation layer 106 to be in direct contact with the corresponding conductive pad 108. That is, the conductive terminals 110 are electrically connected to the interconnection layer IC1 through the conductive pads 108. In some embodiments, the conductive terminals 110 are conductive pillars, conductive posts, conductive balls, conductive bumps, or the like. In some embodiments, a material of the conductive terminals 110 includes a variety of metals, metal alloys, or metals and mixture of other materials. For example, the conductive terminals 110 may be made of aluminum, titanium, copper, nickel, tungsten, tin, and/or alloys thereof. The conductive terminals 110 are formed by, for example, deposition, electroplating, screen printing, or other suitable methods. In some embodiments, the conductive terminals 110 are used to establish electrical connection with other components (not shown) subsequently formed or provided. Up to here, an integrated circuit 100 in accordance with some embodiments of the present disclosure is accomplished.

As illustrated in FIG. 1, a plurality of transistors T2 are embedded in the interconnection layer IC1 in between the dielectric layers DLX. The formation method and the structure of the transistor T2 will be described in more detail by referring to FIG. 2A to FIG. 2N shown below.

Figure 2A:
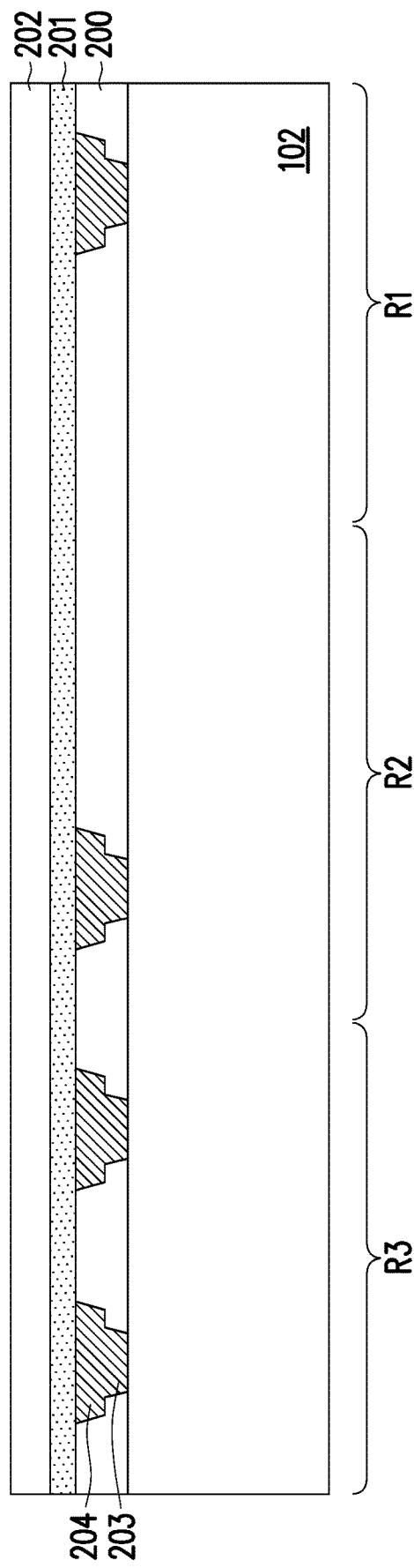
FIG. 2A to FIG. 2N are schematic perspective views illustrating various stages of a method of forming a semiconductor device including transistors shown in FIG. 1.
Figure 2B:
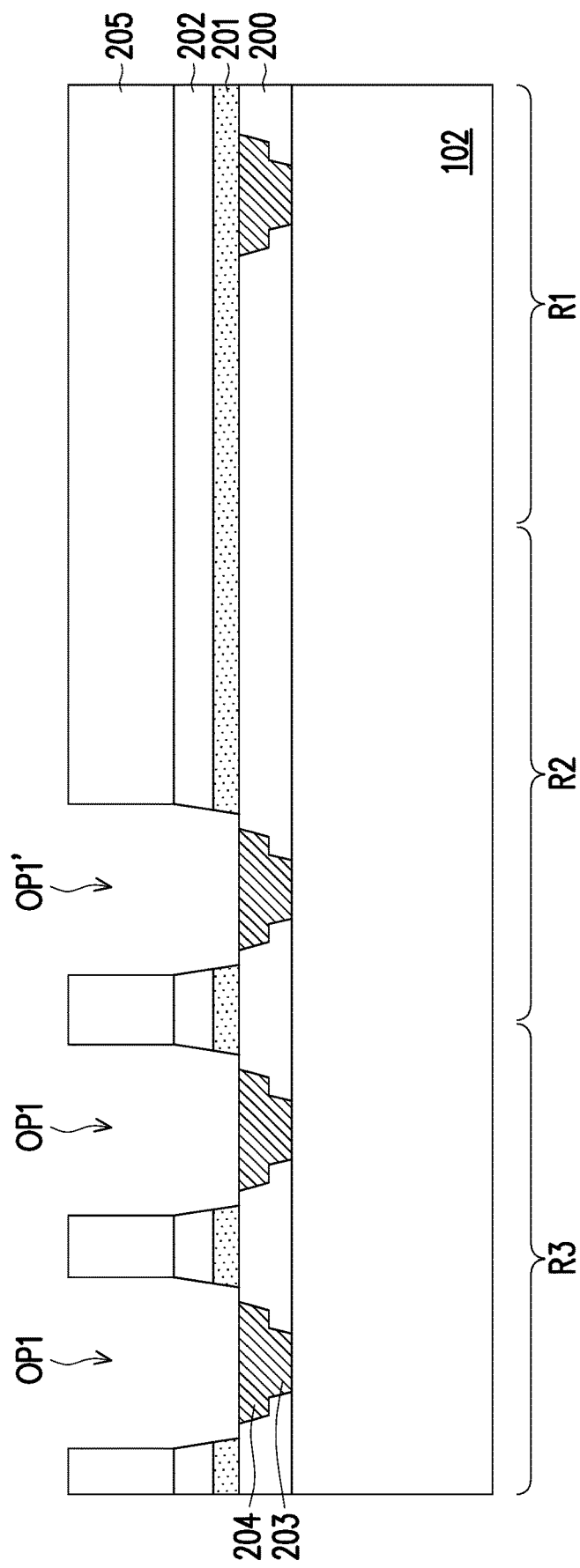
Figure 2C:
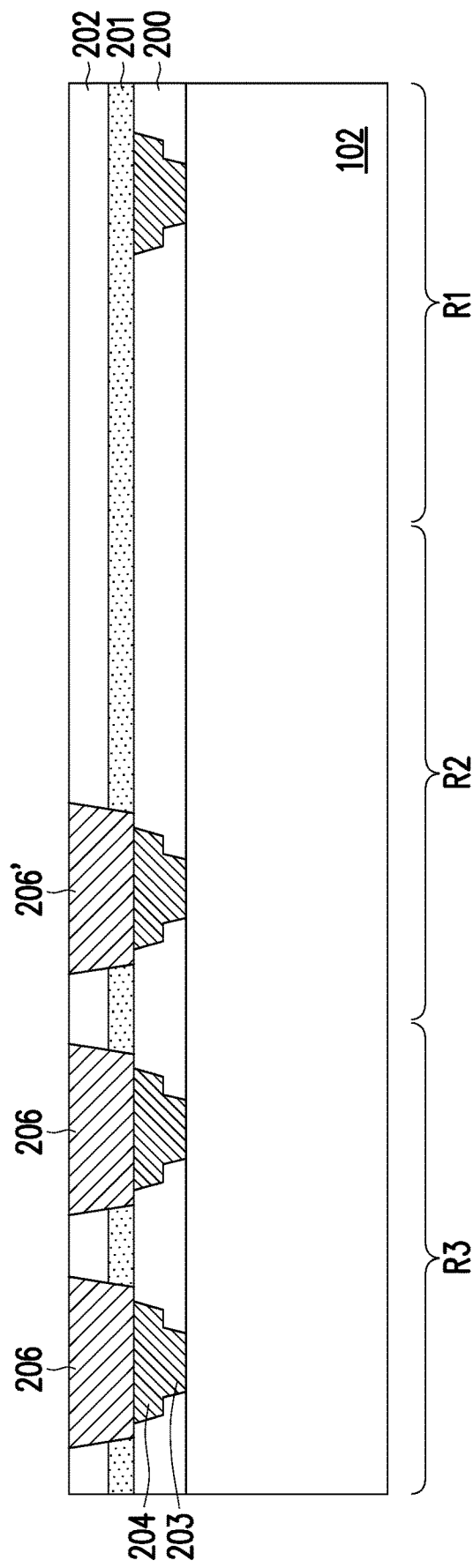
Figure 2D:
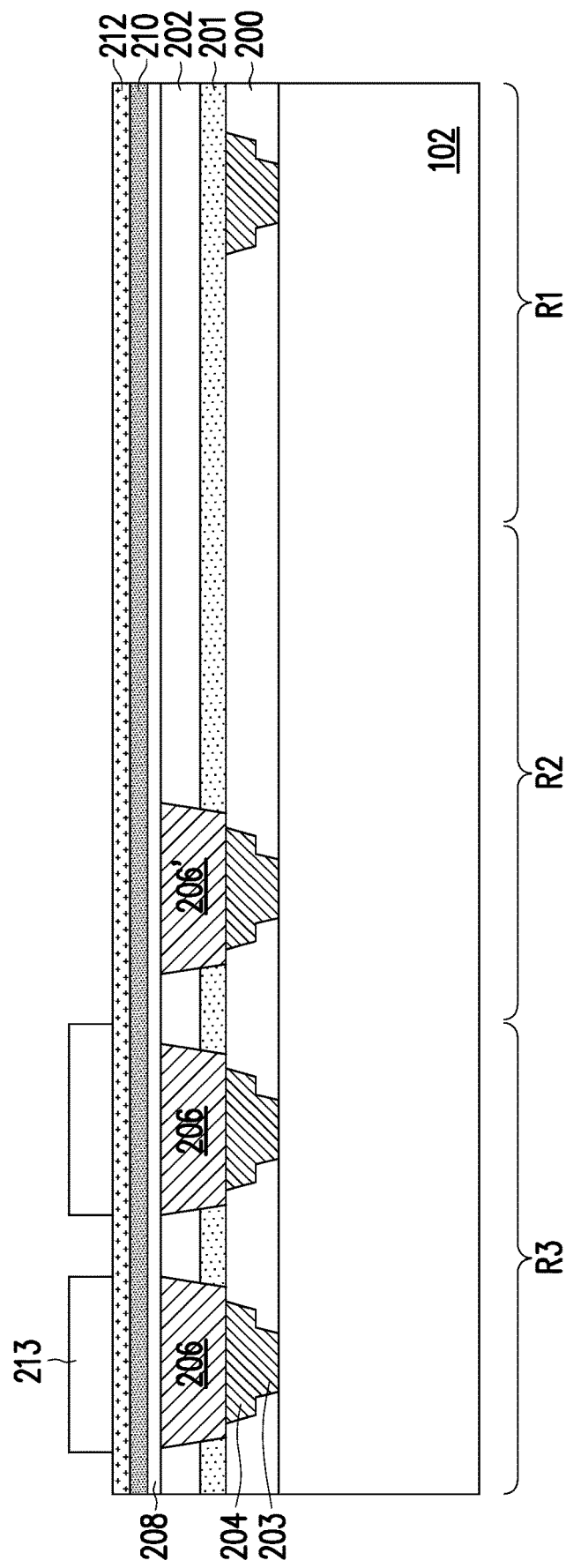
Figure 2E:
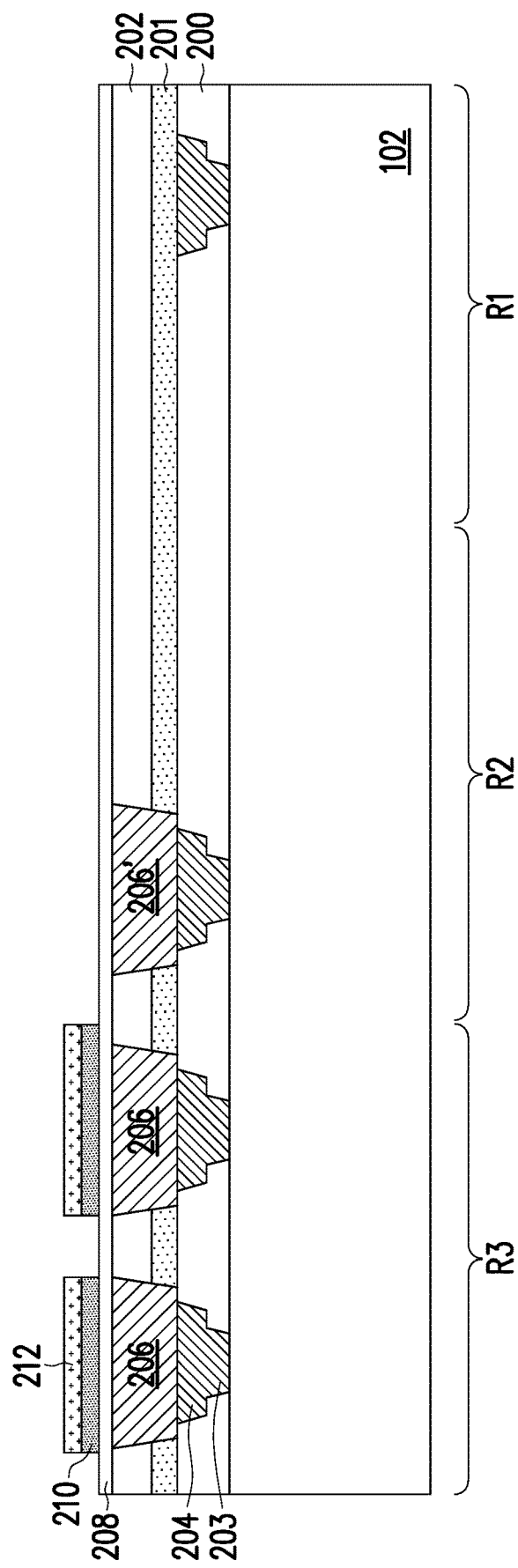
Figure 2F:
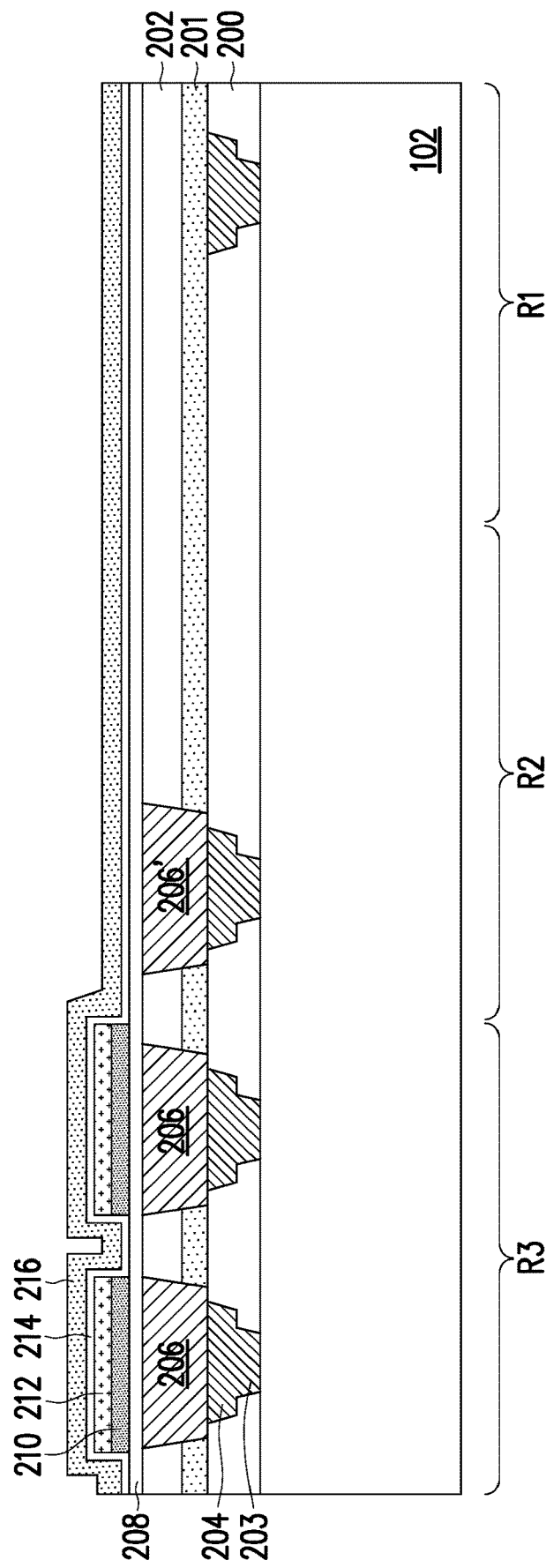
Figure 2G:
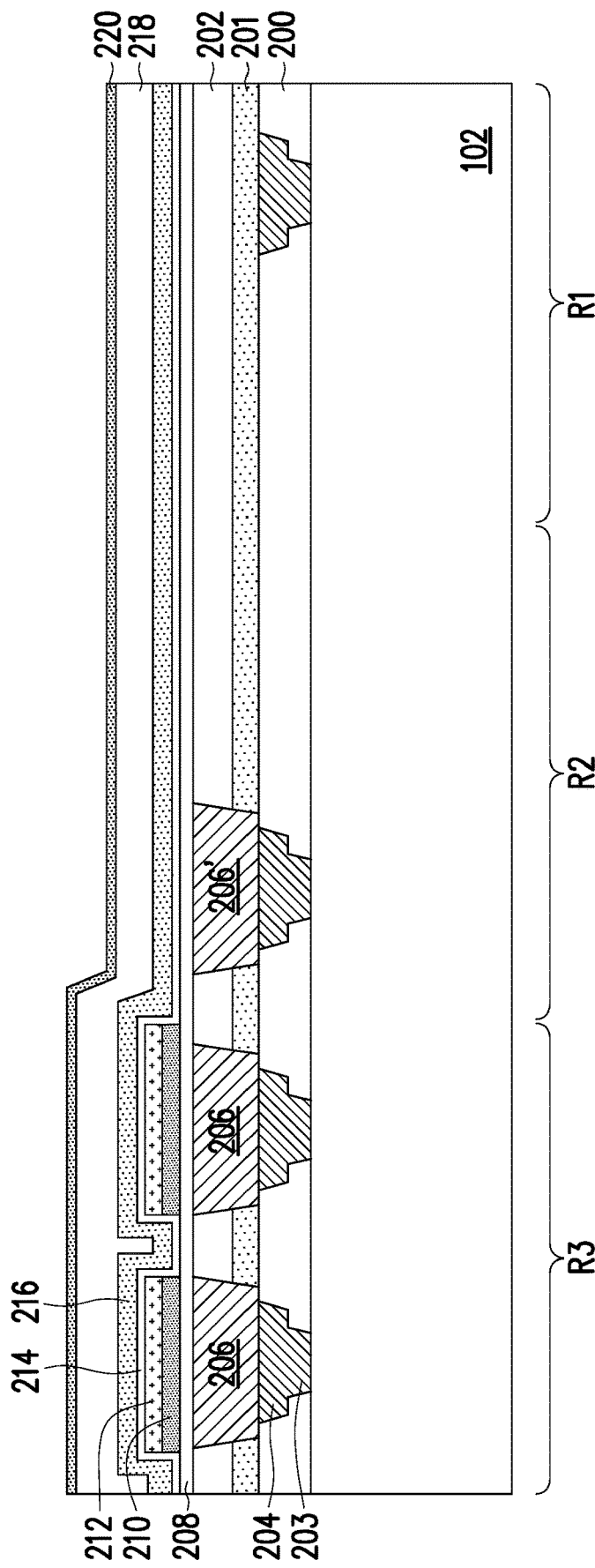
Figure 2H:
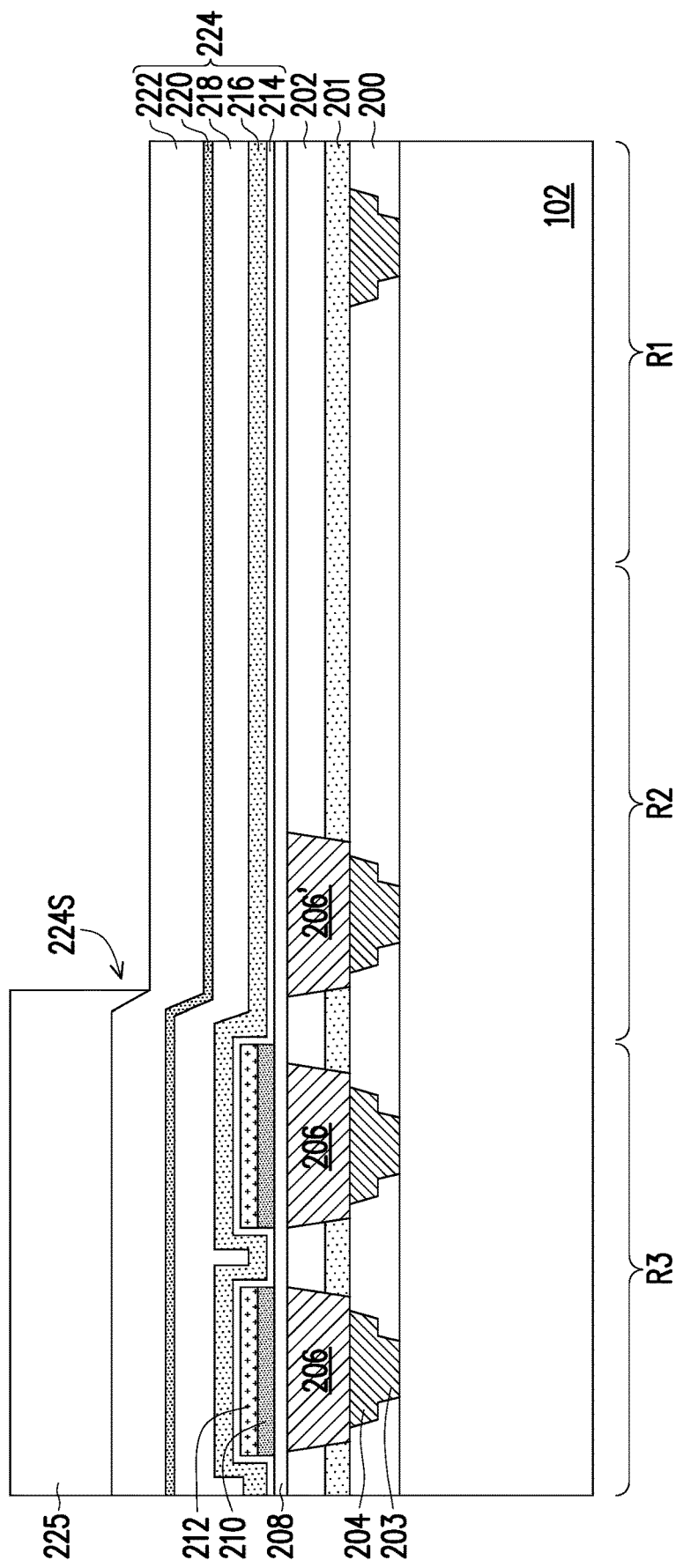
Figure 2I:
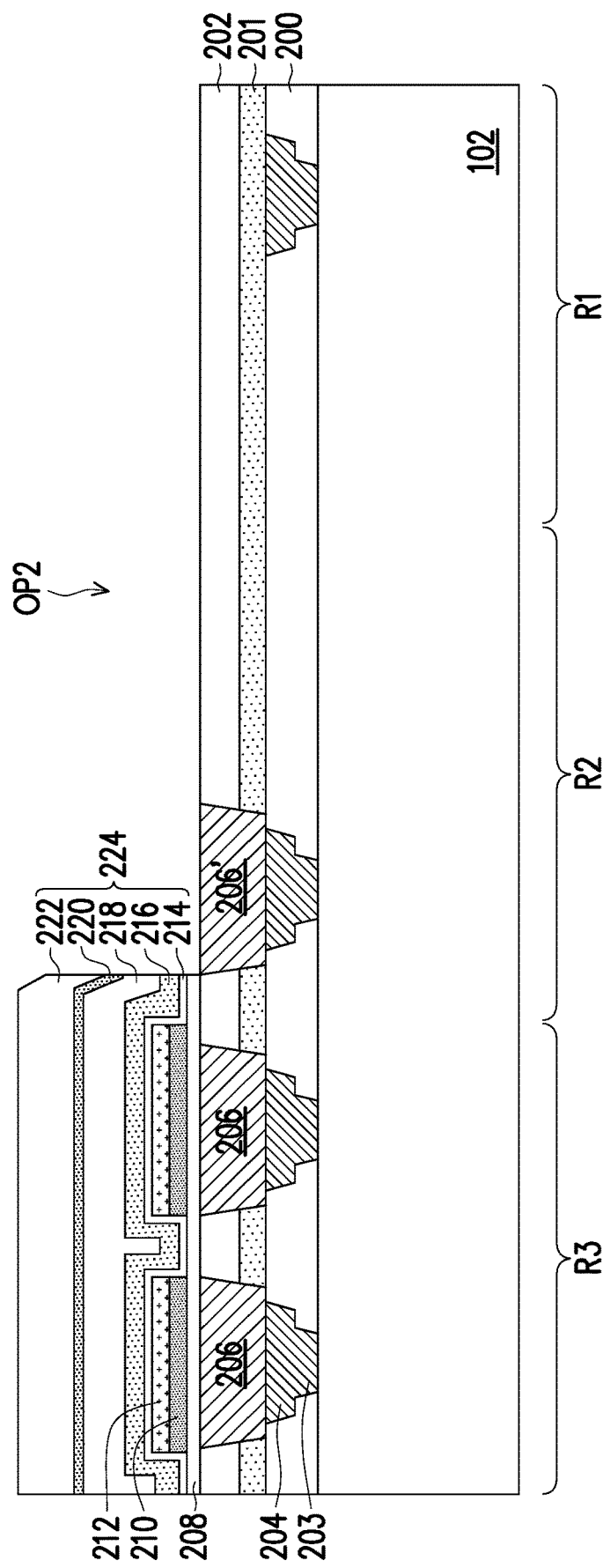
Figure 2J:
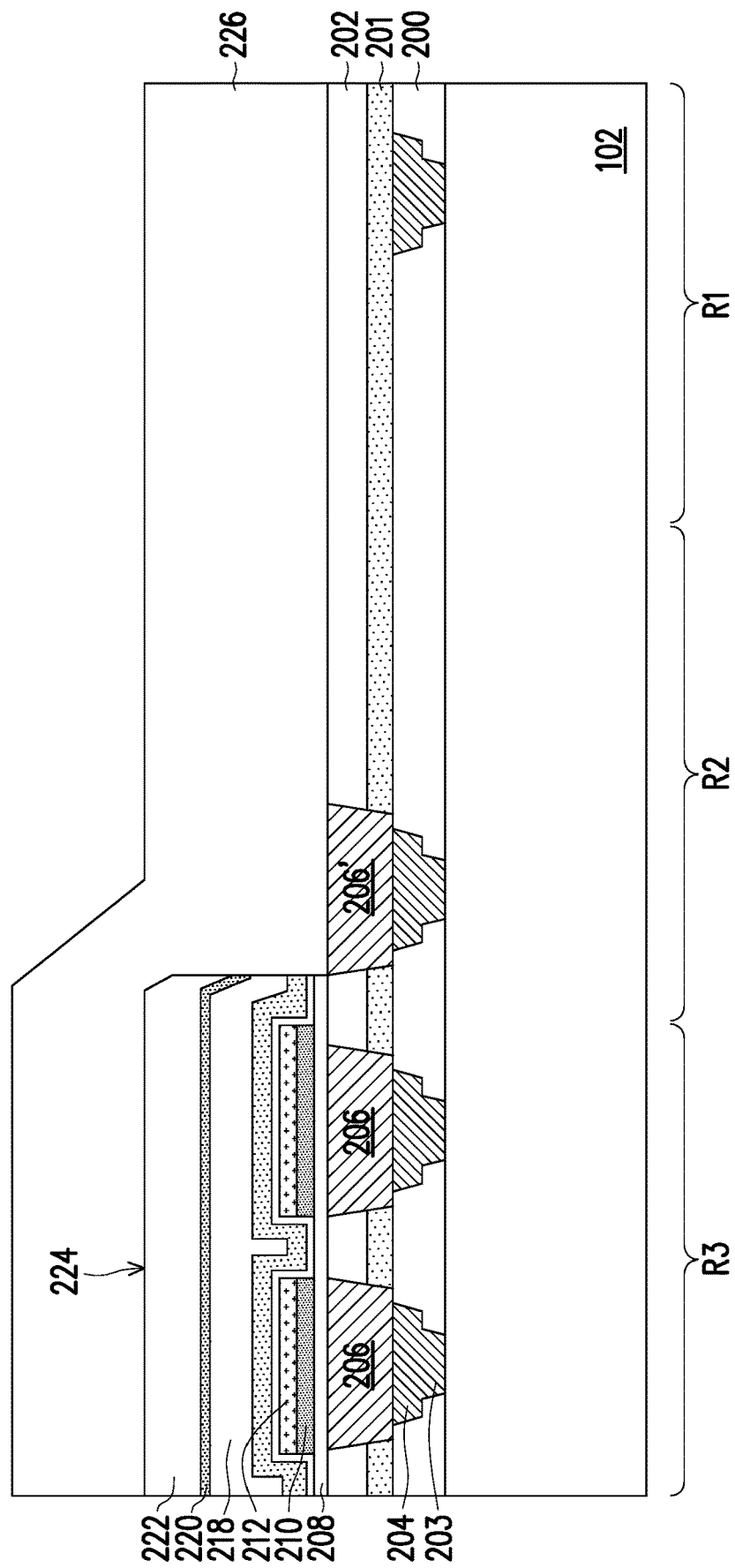
Figure 2K:
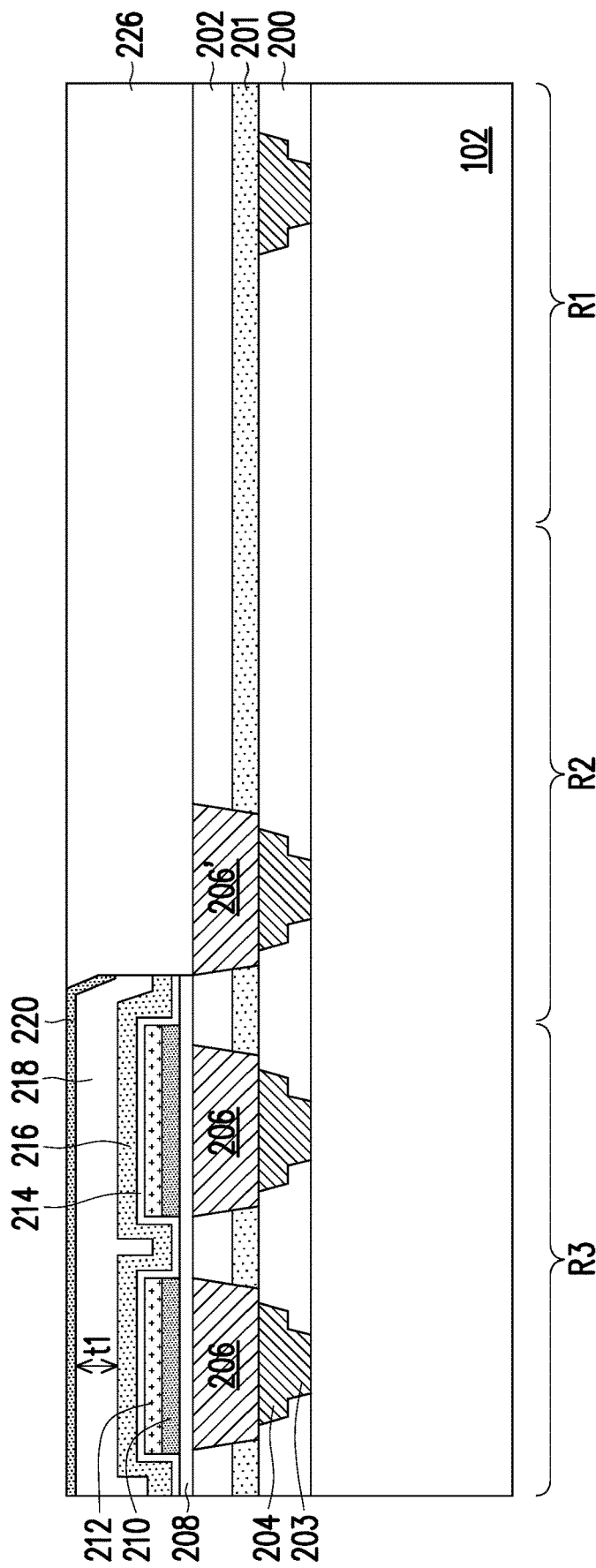
Figure 2L:
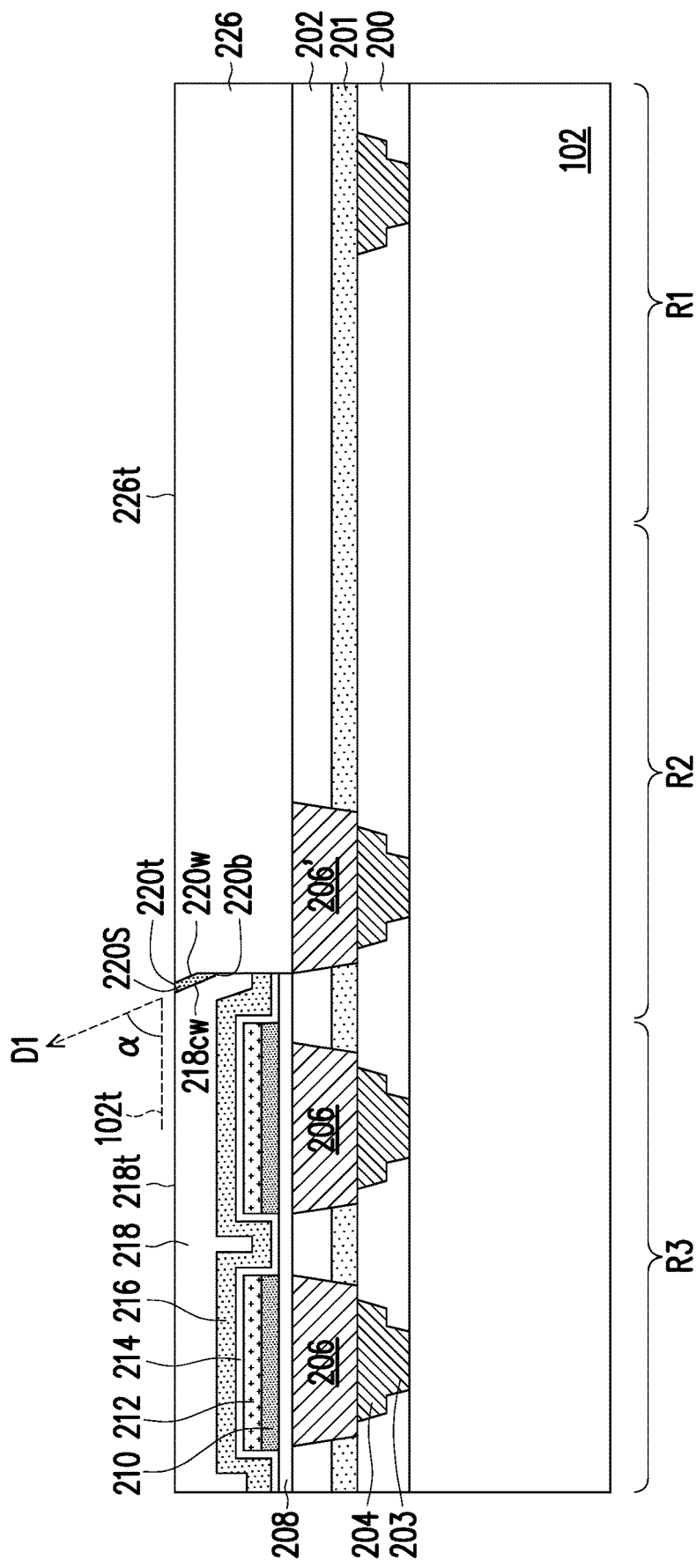
Figure 2M:
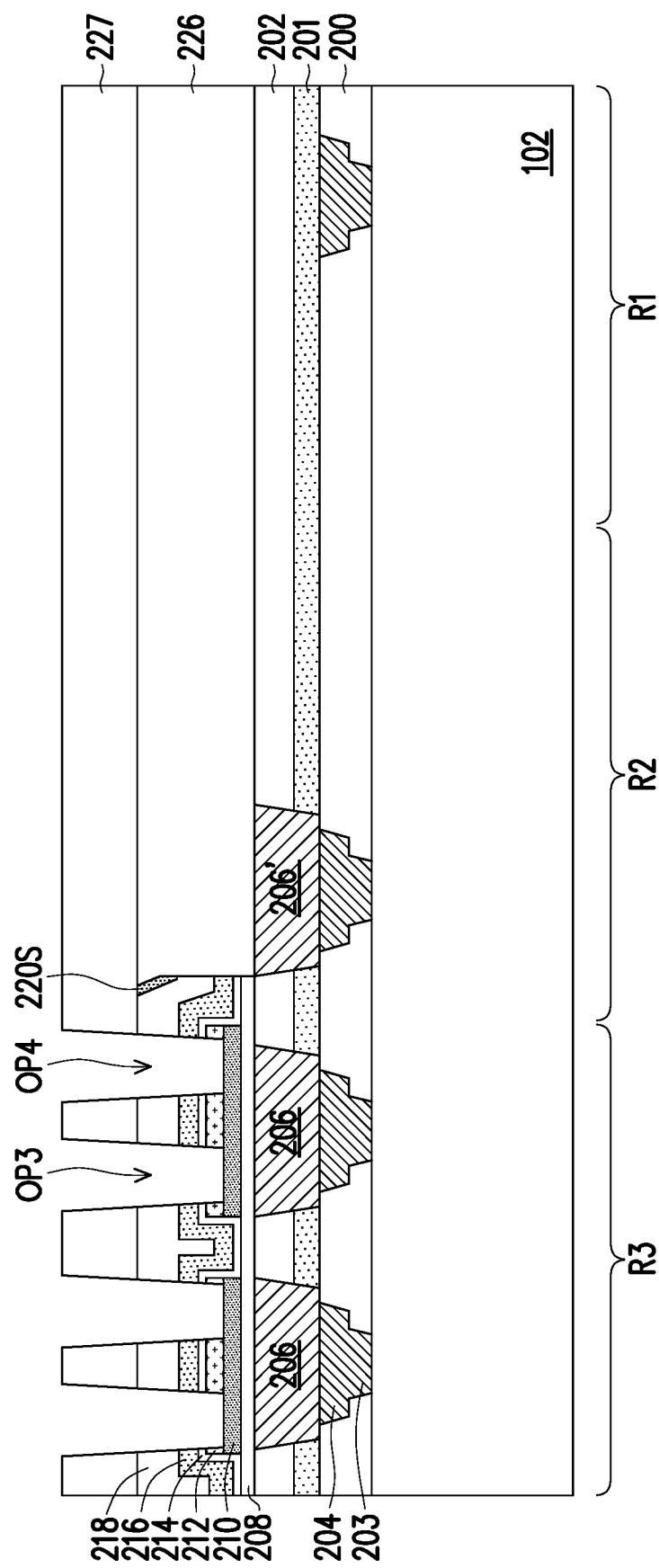
Figure 2N:
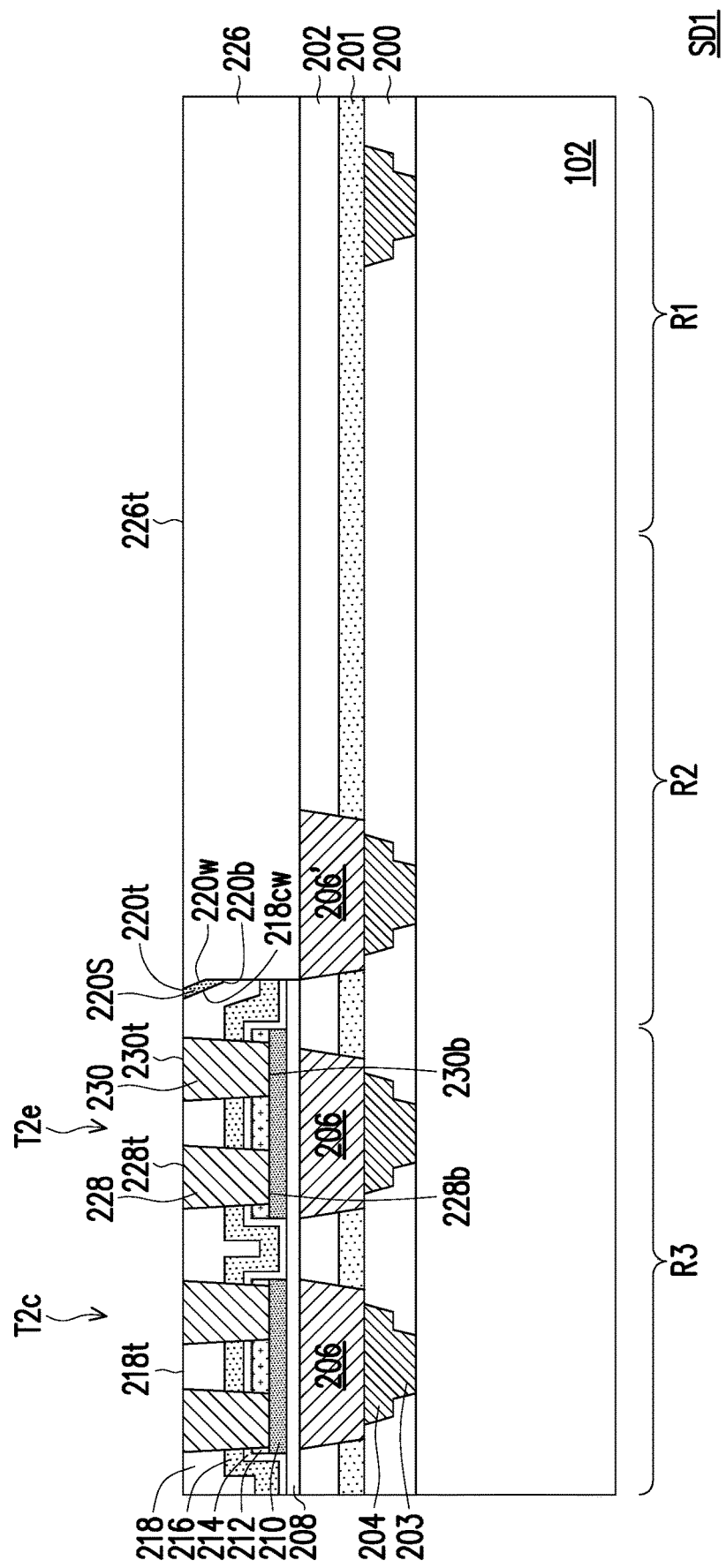

FIG. 2A to FIG. 2N are schematic perspective views illustrating various stages of a manufacturing method of a semiconductor device including the transistor T2 shown in FIG. 1. Referring to FIG. 2A, the substrate 102 of the integrated circuit 100 shown in FIG. 1 may include a first region R1, a second region R2 and a third region R3. The second region R2 is located between the first region R1 and the third region R3. In some embodiments, the first region R1 a logic region, the third region includes a memory cell region, and the second region includes a connection region connected to the logic region and the memory cell region.

Referring to FIG. 2A, a dielectric layer 200 is formed over the substrate 102. In some embodiments, the dielectric layer 202 may be formed directly on the substrate 102 and contacting the substrate 102. In some embodiment, the dielectric layer 200 corresponds to one of the dielectric layers DLX of the integrated circuit 100 (shown in FIG. 1). Alternatively, there may be a plurality of dielectric layers DLX located in between the dielectric layer 200 and the substrate 102. In some embodiments, the dielectric layer 200 includes silicon oxide, silicon nitride, silicon oxynitride, or the like, which may be deposited by CVD, physical vapor deposition (PVD), atomic layer deposition (ALD), PECVD, or the like.

Conductive vias 203 and conductive patterns 204 are formed in the dielectric layer 200. In some embodiment, the conductive vias 203 and conductive patterns 204 correspond to the conductive vias CL1 and the conductive patterns CL2. Thereafter, an etch stop layer 201 and a dielectric layer 202 are formed on the dielectric layer 200 and the conductive patterns 204. In some embodiment, the etch stop layer 201 and the dielectric layer 202 corresponds to the dielectric layers DLX of the integrated circuit 100 (shown in FIG. 1). In some embodiments, the etch stop layer 201 includes silicon nitride, silicon oxynitride, or the like, and the dielectric layer 202 includes silicon oxide, which may be deposited by CVD, physical vapor deposition (PVD), atomic layer deposition (ALD), PECVD, or the like.

Referring to FIG. 2B, a photoresist pattern 205 is formed on the dielectric layer 202. The photoresist pattern 205 may include openings revealing portions of the dielectric layer 202. For example, the openings correspond to a shape of a gate electrode formed in subsequent steps. In other words, the shape of the photoresist pattern 205 is not particularly limited, and will depend on the design requirements of the gate electrode. In one embodiment, the photoresist pattern 205 may be formed by coating (such as spin-coating) and photolithography processes or the like; however, the disclosure is not limited thereto. A material of the photoresist pattern 205, for example, includes a positive resist material or a negative resist material, that is suitable for a patterning process such as a photolithography process with a mask or a mask-less photolithography process (for instance, an electron-beam (e-beam) writing or an ion-beam writing).

After providing the photoresist pattern 205 on the dielectric layer 202, an etching process is performed to remove portions of the dielectric layer 202 and the etch stop layer 201. For example, portions of the dielectric layers 202 not covered by the photoresist pattern 205 are removed by using the etch stop layer 201 as a stop layer. Thereafter, the etch stop layer 201 is etched. In certain embodiments, the dielectric layers 202 and the etch stop layer 201 are etched or patterned to form first openings OP1 in the third region R3. Although only two first openings OP1 are illustrated in the third region R3, it should be noted that the number of first openings OP1 formed in the dielectric layers 202 and the etch stop layer 201 will correspond to the number of gate electrodes formed in the integrated circuit 100. In some embodiments, an opening OP1' is also formed in dielectric layers 202 and the etch stop layer 201 in the second region R2.

Referring to FIG. 2C, the photoresist pattern 205 is removed. In a subsequent step, gate electrodes 206 are formed within the first openings OP1 of the dielectric layers 202 and the etch stop layer 201. In some embodiments, the gate electrodes 206 are formed in the first openings OP1 by filling the first openings OP1 with a conductive material, and a planarization process (e.g., a chemical-mechanical planarization (CMP) process) is performed to remove excessive conductive material, thereby forming the gate electrodes 206. A conductive pattern 206' may be formed within the opening OP1' of the dielectric layers 202 and the etch stop layer 201. The conductive pattern 206' and the gate electrodes 206 may be formed at the same time. In some embodiments, top surfaces of the gate electrodes 206 and the conductive pattern 206' are coplanar with a top surface of the dielectric layer 202.

In some embodiments, the gate electrodes 206 and the conductive pattern 206' include conductive materials such as copper, titanium, tantalum, tungsten, aluminum, zirconium, hafnium, cobalt, titanium aluminum, tantalum aluminum, tungsten aluminum, zirconium aluminum, hafnium aluminum, any other suitable metal-containing material, or a combination thereof. In some embodiments, the gate electrodes 206 and the conductive pattern 206' also includes materials to fine-tune the corresponding work function. For example, the conductive material of the gate electrodes 206 and the conductive pattern 206' may include p-type work function materials such as Ru, Mo, WN, $ZrSi_2$, $MoSi_2$, $TaSi_2$, $NiSi_2$, or combinations thereof, or n-type work function materials such as Ag, TaCN, Mn, or combinations thereof. In some embodiments, the conductive material of the gate electrodes 206 and the conductive pattern 206' are deposited through ALD, CVD, PVD, or the like.

Referring to FIG. 2D, after forming the gate electrodes 206 and the conductive pattern 206', a gate dielectric layer 208 (or high-K layer) is formed over the gate electrodes 206 and the conductive pattern 206'. The gate dielectric layer 208 may be a ferroelectric layer. In some embodiments, the ferroelectric layer includes materials that are capable of switching between two different polarization directions by applying an appropriate voltage differential across the ferroelectric layer. For example, the gate dielectric layer 208 includes a high-k dielectric material, such as a hafnium (Hf) based dielectric materials or the like. In some embodiments, the gate dielectric layer 208 includes hafnium oxide, hafnium zirconium oxide, aluminum hafnium zirconium oxide, silicon-doped hafnium oxide, or the like.

In some other embodiments, the gate dielectric layer 208 include materials such as barium titanium oxide ($BaTiO_3$), aluminum nitride (AlNx) lead titanium oxide ($PbTiO_3$), lead zirconium oxide ($PbZrO_3$), lithium niobium oxide ($LiNbO_3$), sodium niobium oxide ($NaNbO_3$), potassium niobium oxide ($KNbO_3$), potassium tantalum oxide ($KTaO_3$), bismuth scandium oxide ($BiScO_3$), bismuth iron oxide ($BiFeO_3$), hafnium erbium oxide ($Hf_{1-x}Er_xO$), hafnium lanthanum oxide ($Hf_{1-x}La_xO$), hafnium yttrium oxide ($Hf_{1-x}Y_xO$), hafnium gadolinium oxide ($Hf_{1-x}Gd_xO$), hafnium aluminum oxide ($Hf_{1-x}Al_xO$), hafnium zirconium oxide ($Hf_{1-x}Zr_xO$, HZO), hafnium titanium oxide ($Hf_{1-x}Ti_xO$), hafnium tantalum oxide ($Hf_{1-x}Ta_xO$), or the like. In some embodiments, the method of forming the gate dielectric layer 208 includes performing a suitable deposition technique, such as CVD, PECVD, metal oxide chemical vapor deposition (MOCVD), ALD, remote plasma atomic layer deposition (RPALD), plasma enhanced atomic layer deposition (PEALD), molecular beam deposition (MBD) or the like.

Referring to FIG. 2D, a channel layer 210 is formed over the gate dielectric layer 208. In some embodiments, the channel layer 210 is made of oxide semiconductor materials such as indium-gallium-zinc oxide (InGaZnO), gallium oxide ($Ga_2O_3$), indium oxide ($In_2O_3$), zinc oxide (ZnO), indium tin oxide (ITO), indium tungsten oxide (IWO), or the like. In some embodiments, the channel layer 210 is formed by any suitable method, such as atomic layer deposition (ALD), chemical vapor deposition (CVD), metal organic chemical vapor deposition (MOCVD), plasma enhanced chemical vapor deposition (PECVD), sputtering or the like. Furthermore, the channel layer 210 may be single crystalline, poly crystalline, or amorphous.

Referring to FIG. 2D, a cap layer 212 is formed over the channel layer 210. In some embodiments, the cap layer 212 includes insulating materials such as silicon oxide, silicon nitride, silicon oxynitride, or the like, which may be deposited by CVD, physical vapor deposition (PVD), atomic layer deposition (ALD), PECVD, or the like.

Referring to FIG. 2D, in a subsequent step, a photoresist pattern 213 is formed on the cap layer 212. The photoresist pattern 213 may cover portions of the cap layer 212, which is used to define a device region of the formed transistor. In one embodiment, the photoresist pattern 213 may be formed by coating (such as spin-coating) and photolithography processes or the like; however, the disclosure is not limited thereto. A material of the photoresist pattern 213, for example, includes a positive resist material or a negative resist material, that is suitable for a patterning process such as a photolithography process with a mask or a mask-less photolithography process (for instance, an electron-beam (e-beam) writing or an ion-beam writing).

Referring to FIG. 2E, after providing the photoresist pattern 213, the cap layer 212, and the channel layer 210 may be patterned together. For example, portions of the cap layer 212, and the channel layer 210 not covered by the photoresist pattern 213 may be removed. After the patterning process, sidewalls of the channel layer 210 may be aligned with sidewalls of the cap layer 212. Thereafter, the photoresist pattern 213 is removed.

Referring to FIG. 2F, a liner layer 214 may be formed over the substrate 102 to cover and surround the cap layer 212, the channel layer 210, and the gate dielectric layer 208. In some embodiments, the liner layer 214 include materials such as polyimide, epoxy resin, acrylic resin, phenol resin, benzocyclobutene (BCB), polybenzooxazole (PBO), or any other suitable polymer-based dielectric material. Alternatively, the liner layer 214 may be formed of oxides or nitrides, such as silicon oxide, silicon nitride, or the like. The liner layer 214 may be formed by suitable fabrication techniques such as spin-on coating, CVD, PECVD, or the like.

Referring to FIG. 2F, an intermediate layer 216 may be formed on the liner layer 214 by ALD, CVD, or the like. In some embodiments, the intermediate layer 216 includes gas impermeable materials. The impermeable materials may include insulating materials. The insulating materials may include metal oxide such as aluminum oxide, titanium oxide, a combination thereof, or the like. In certain embodiments, the intermediate layer 216 is impermeable to gases such as oxygen, water vapor, or the like. Although aluminum oxide and titanium oxide are used as examples of the intermediate layer 216, it is noted that other materials may be used as long as they are impermeable to gases such as oxygen, water vapor etc. The thickness of the intermediate layer 216 is in a range of 30 angstroms to 300 angstroms.

Referring to FIG. 2G, a first insulating layer 218 and a stop layer 220 are formed on the intermediate layer 216. The first insulating layer 218 include materials such as polyimide, epoxy resin, acrylic resin, phenol resin, benzocyclobutene (BCB), polybenzooxazole (PBO), or any other suitable polymer-based dielectric material. Alternatively, the first insulating layer 218 may be formed of oxides, such as silicon oxide. The stop layer 220 may be insulating materials, and the insulating materials include nitrides or carbides such as silicon nitride (SiN), SiC, SiCN, SiCON, or the like. Alternatively, the stop layer 220 may be formed of conductive materials, and the conductive materials include silicon such as amorphous silicon. The first insulating layer 218 and the stop layer 220 may be formed by suitable fabrication techniques such as spin-on coating, CVD, PECVD, or the like. The thickness of the stop layer 220 is in a range of 20 angstroms to 500 angstroms.

Referring to FIG. 2H, a second insulating layer 222 is formed over the stop layer 220. The second insulating layer 222 includes materials such as polyimide, epoxy resin, acrylic resin, phenol resin, benzocyclobutene (BCB), polybenzooxazole (PBO), or any other suitable polymer-based dielectric material. Alternatively, the second insulating layer 222 may be formed of oxides, such as silicon oxide or the like. The second insulating layer 222 may be formed by suitable fabrication techniques such as spin-on coating, CVD, PECVD, or the like.

The liner layer 214, the intermediate layer 216, the first insulating layer 218, the stop layer 220 and the second insulating layer 222 may be collectively referred to as an insulating stack 224 in some embodiments. The stop layer 220 is inserted between the first insulating layer 218 and the second insulating layer 222, and thus the stop layer 220 may be referred to as a liner insertion layer. The liner layer 214, the intermediate layer 216, the first insulating layer 218, the stop layer 220 and the second insulating layer 222 may be conformal layers. Since the cap layer 212 and the channel layer 210 are formed on the third region R3, a top surface of the insulating stack 224 in the third region R3 and a top surface of the insulating stack 224 in the second region R2 are at different levels and form a step 224S therebetween.

Referring to FIG. 2H, after forming the insulating stack 224, a photoresist pattern 225 is formed on the second insulating layer 222. The photoresist pattern 225 may cover portions of the second insulating layer 222 in the third region R3 and a portion of the second region R2, which is used to define a region of the formed transistor. In one embodiment, the photoresist pattern 225 may be formed by coating (such as spin-coating) and photolithography processes or the like; however, the disclosure is not limited thereto. A material of the photoresist pattern 225, for example, includes a positive resist material or a negative resist material, that is suitable for a patterning process such as a photolithography process with a mask or a mask-less photolithography process (for instance, an electron-beam (e-beam) writing or an ion-beam writing).

Referring to FIG. 2I, after providing the photoresist pattern 225, the insulating stack 224 and the gate dielectric layer 208 may be patterned together. For example, portions of the insulating stack 224 and the gate dielectric layer 208 not covered by the photoresist pattern 225 may be removed to form a second opening OP2 revealing the dielectric layer 202 in the first region R1 and the second region R2 and the conductive pattern 206' in the second region R2. In some embodiments, after the patterning process, the insulating stack 224 and the gate dielectric layer 208 are left on the dielectric layer 202 in the third region R3 and portions of the insulating stack 224 and the gate dielectric layer 208 are left on the dielectric layer 202 in the second region R2. In some embodiments, a sidewall of the insulating stack 224 in the third region R3 may be aligned with a sidewalls of the gate dielectric layer 208 in the third region R3. Thereafter, the photoresist pattern 225 is removed.

Referring to FIG. 2J, thereafter, a dielectric layer 226 is formed on the insulating stack 224 and fills in the second opening OP2 in the first region R1 and the second region R2. In some embodiments, the dielectric layer 226 includes materials such as polyimide, epoxy resin, acrylic resin, phenol resin, benzocyclobutene (BCB), polybenzooxazole (PBO), or any other suitable polymer-based dielectric material. Alternatively, the dielectric layer 226 may be formed of oxides or nitrides, such as silicon oxide, silicon nitride, or the like. The dielectric layer 226 may be formed by suitable fabrication techniques such as spin-on coating, CVD, PECVD, or the like. In certain embodiments, the dielectric layer 226 corresponds to the dielectric layer DLX of the integrated circuit 100 (shown in FIG. 1).

Referring to FIG. 2K, the dielectric layer 226 in the third region R3 is removed until the stop layer 220 is exposed by a planarization process, which may use a CMP process and/or an etching back process. The material of the stop layer 220 is different from the materials of the dielectric layer 226 and the second insulating layer 222. During the planarization process, the stop layer 220 may be served as a polish stop layer or an etching stop layer. In some embodiments, a polishing/etching selectivity of the dielectric layer 226 to the stop layer 220 is in a range from 1 to 500. A polishing/etching selectivity of the second insulating layer 222 to the stop layer 220 is in a range from 1 to 500. The dielectric layer 226 and the second insulating layer 222 in the central region and the edge region of the substrate 102 may be removed until the stop layer 220 is exposed. As a result, the first insulating layer 218 has a good uniformity after the planarization process is performed. In some embodiments, the thickness t1 of the first insulating layer 218 below the stop layer 220 in the central region is substantially the equal to or similar to the thickness t1 of the first insulating layer 218 below the stop layer 220 in the edge region of the substrate 102. By providing the stop layer 220, the issue of uneven thickness of the first insulating layer 218 in the central region and the edge region of the substrate 102 may be avoided.

Referring to FIG. 2L, after the planarization process, an etching process such as a wet etch process, a dry etch process a combination thereof is performed to remove a portion of the stop layer 220. In some embodiments, the portion of the stop layer 220 on a top surface of the first insulating layer 218 is removed, and portion of the stop layer 220 located on a inclined sidewall 218cw of the first insulating layer 218 is left to form a stop segment 220S. In some embodiments, the stop segment 220S may be referred to as an insertion segment.

The stop segment 220S is embedded in the first insulating layer 218 and the dielectric layer 226 in the second region R2. The liner layer 214, the intermediate layer 216, the first insulating layer 218, and the dielectric layer 226 may be referred to as a portion of the plurality of dielectric layers DLX of the integrated circuit 100 (shown in FIG. 1). Therefore, the liner layer 214, the intermediate layer 216, the first insulating layer 218, and the dielectric layer 226 may be collectively referred to as dielectric layers 214, 216, 218 and 226. In some embodiments, the stop segment 220S is embedded in the dielectric layer 226 and the first insulating layer 218 in the second region R2. The first insulating layer 218 in the third region R3 is free of the stop segment 220S, and the dielectric layer 226 in the first region R1 is also free of the stop segment 220S.

The stop segment 220S is formed on the inclined sidewall 218cw of the first insulating layer 218 along an extension direction D1. The extension direction D1 and a top surface 102t of the substrate 102 form an acute angle α. Sidewalls 220w and bottom 220b of the stop segment 220S are enclosed by the dielectric layers (i.e., 218 and 226). In some embodiments, a top surface of the stop segment 220S is coplanar with top surface 218t and 226t of the dielectric layers (i.e., 218 and 226). The bottom 220b of the stop segment 220S may be higher than a top surface of the intermediate layer 216, a top surface of the liner layer 214, a top surface of the cap layer 212, a top surface of the channel layer 210, and a top surface of the gate dielectric layer 208.

Referring to FIG. 2M, a photoresist pattern 227 is formed on the dielectric layer 226 and the first insulating layer 218. The photoresist pattern 227 may include openings revealing portions of the first insulating layer 218. For example, the openings correspond to a shape of sources/drain electrodes formed in subsequent steps. In other words, the shape of the photoresist pattern 227 is not particularly limited, and will depend on the design requirements of the gate electrode. In one embodiment, the photoresist pattern 227 may be formed by coating (such as spin-coating) and photolithography processes or the like; however, the disclosure is not limited thereto. A material of the photoresist pattern 227, for example, includes a positive resist material or a negative resist material, that is suitable for a patterning process such as a photolithography process with a mask or a mask-less photolithography process (for instance, an electron-beam (e-beam) writing or an ion-beam writing).

After providing the photoresist pattern 227, an etching process is performed to remove portions of the first insulating layer 218, the intermediate layer 216, the liner layer 214, and the cap layer 212 to form third openings OP3 and fourth openings OP4 revealing the channel layer 210 in the third region R3. The etching process may include a wet etching process, a dray etching process, or a combination thereof. Thereafter, the photoresist pattern 227 is removed.

Referring to FIG. 2N, first source/drain electrodes 228 and second source/drain electrodes 230 are formed within the third openings OP3 and the fourth openings OP4 to be connected to the channel layer 210. In some embodiments, the first source/drain electrodes 228 and the second source/drain electrodes 230 are surrounded by the cap layer 212, the liner layer 214, the intermediate layer 216, and the first insulating layer 218.

In some embodiments, top surfaces 228t of the first source/drain electrodes 228 and top surfaces 230t of the second source/drain electrodes 230 are aligned with the top surface 218t of the first insulating layer 218, the top surface 220t of the stop segment 220S, and the top surface 226t of the dielectric layer 226. The first source/drain electrodes 228 and the second source/drain electrodes 230 may be formed of conductive materials including copper, aluminum, tungsten, titanium nitride (TiN), tantalum nitride (TaN), some other conductive materials, or any combinations thereof through ALD, CVD, PVD, or the like. In some embodiments, the first source/drain electrodes 228 and the second source/drain electrodes 230 are formed by filling the third openings OP3 and the fourth opening OP4 with a conductive material, and a planarization process (e.g., a chemical-mechanical planarization (CMP) process) is performed to remove excessive conductive material, thereby forming first source/drain electrodes 228 and second source/drain electrodes. Up to here, a semiconductor device SD1 in accordance with some embodiments of the present disclosure is accomplished.

In some embodiments, the semiconductor device SD1 includes a center transistor T2c and an edge transistor T2e. The edge transistor T2e is closer to the second region R2 than the center transistor T2c. The stop segment 220S is disposed around the boundary of the third region R3 adjacent to the edge transistor T2e. The top surface 220t of the stop segment 220S is at least coplanar with the top surface 230t of the second source/drain electrode 230 and/or the top surface 228t of the first source/drain electrode 228 of the edge transistor T2e. The bottom 220b of the stop segment 220S is higher than a bottom 230b of the second source/drain electrode 230 and a bottom 228b of the first source/drain electrode 228 of the edge transistor T2e. In other some embodiments, the top surface 220t of the stop segment 220S is coplanar with the top surfaces 230t of the second source/drain electrodes 230 and the top surfaces 228t of the first source/drain electrodes 228 of the edge transistor T2e and the center transistor T2c. The bottom 220b of the stop segment 220S is higher than bottoms 230b of the second source/drain electrode 230 and bottoms 228b of the first source/drain electrode 228 of the edge transistor T2e and the center transistor T2c.

Figure 3:
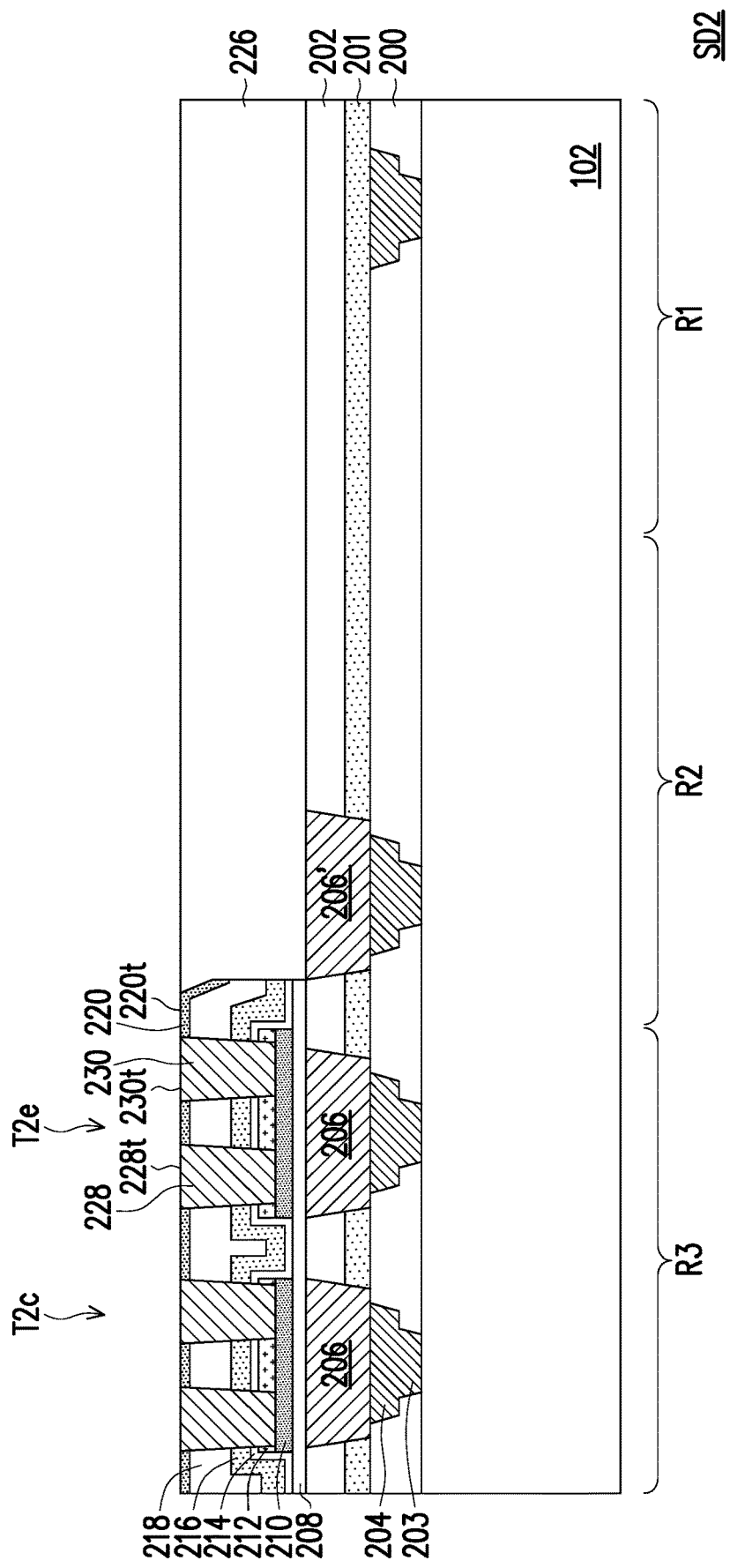
FIG. 3 is a schematic cross-sectional view of a semiconductor device in accordance with some alternative embodiments of the present disclosure.

FIG. 3 is a schematic cross-sectional view of a semiconductor device in accordance with some alternative embodiments of the present disclosure. The semiconductor device SD2 illustrated in FIG. 3 is similar to the semiconductor device SD1 illustrated in FIG. 2N. Therefore, the same reference numerals are used to refer to the same or liked parts, and its detailed description will be omitted herein.

As illustrated in FIG. 3, the semiconductor device SD2 includes the stop layer 220 remained in the third region R3 and a portion of the second region R2. Referring to FIG. 2K, after the planarization process is performed on the dielectric layer 226, the stop layer 220 remains on the first insulating layer 218 in the third region R3 and the portion of the second region R2 near the third region R3 until the first source/drain electrodes 228 and the second source/drain electrodes 230 are formed shown in FIG. 3. As such, the first source/drain electrodes 228 and the second source/drain electrodes 230 are formed further through the stop layer 220.

Figure 4:
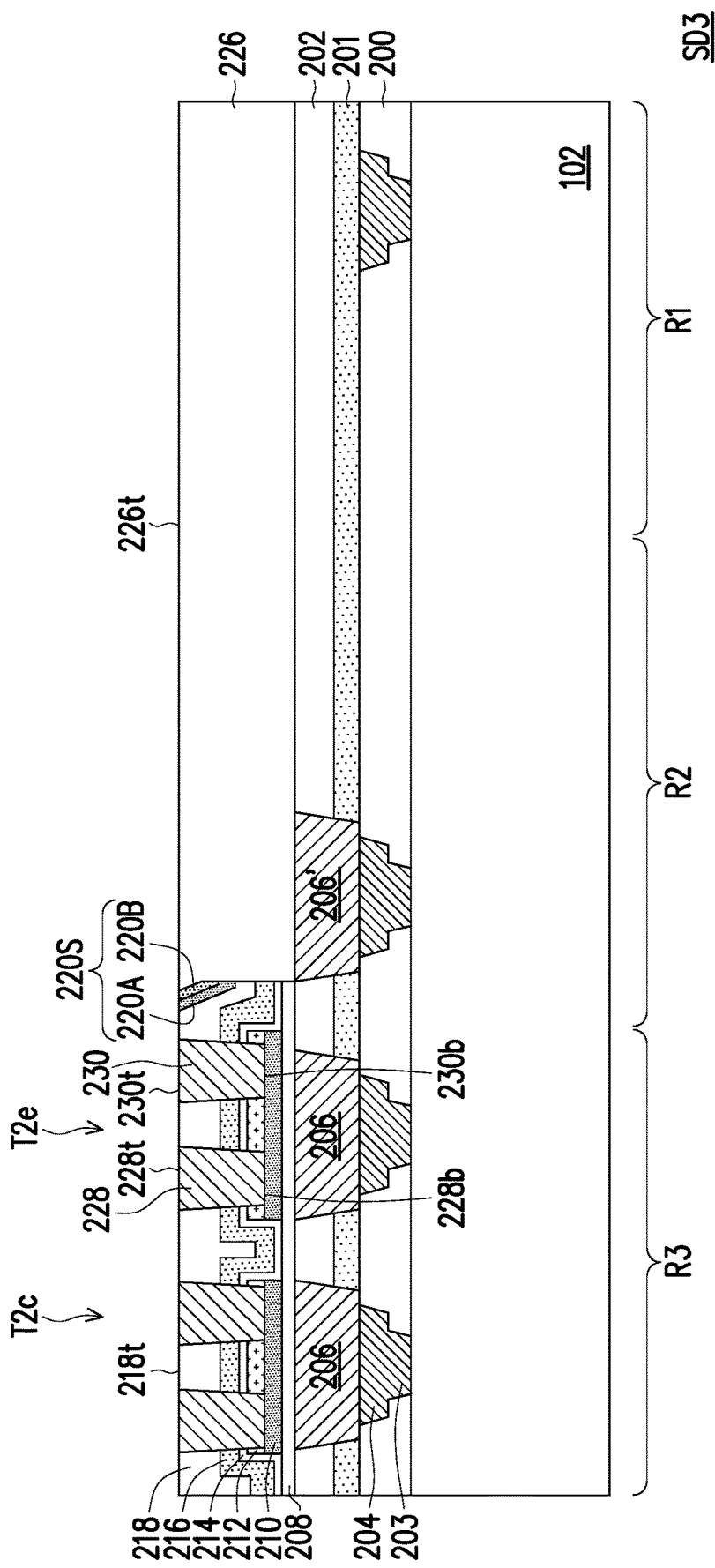
FIG. 4 is a schematic cross-sectional view of a semiconductor device in accordance with some alternative embodiments of the present disclosure.

FIG. 4 is a schematic cross-sectional view of a semiconductor device in accordance with some alternative embodiments of the present disclosure. The semiconductor device SD3 illustrated in FIG. 4 is similar to the semiconductor device SD1 illustrated in FIG. 2N. Therefore, the same reference numerals are used to refer to the same or liked parts, and its detailed description will be omitted herein.

As illustrated in FIG. 4, the semiconductor device SD3 includes a stop segment 220S. The stop segment 220S includes a composite material. In some embodiments, the stop segment 220S includes a first sub-stop layer 220A and a second sub-stop layer 220B in contact with each other. The first sub-stop layer 220A is in contact with first insulating layer 218, while the second sub-stop layer 220B in in contact with dielectric layer 226. In some embodiments, the first sub-stop layer 220A and the second sub-stop layer 220B have different materials. In alternative embodiments, the stop segment 220S may be a composite material that includes more sub-stop layers.

Figure 5:
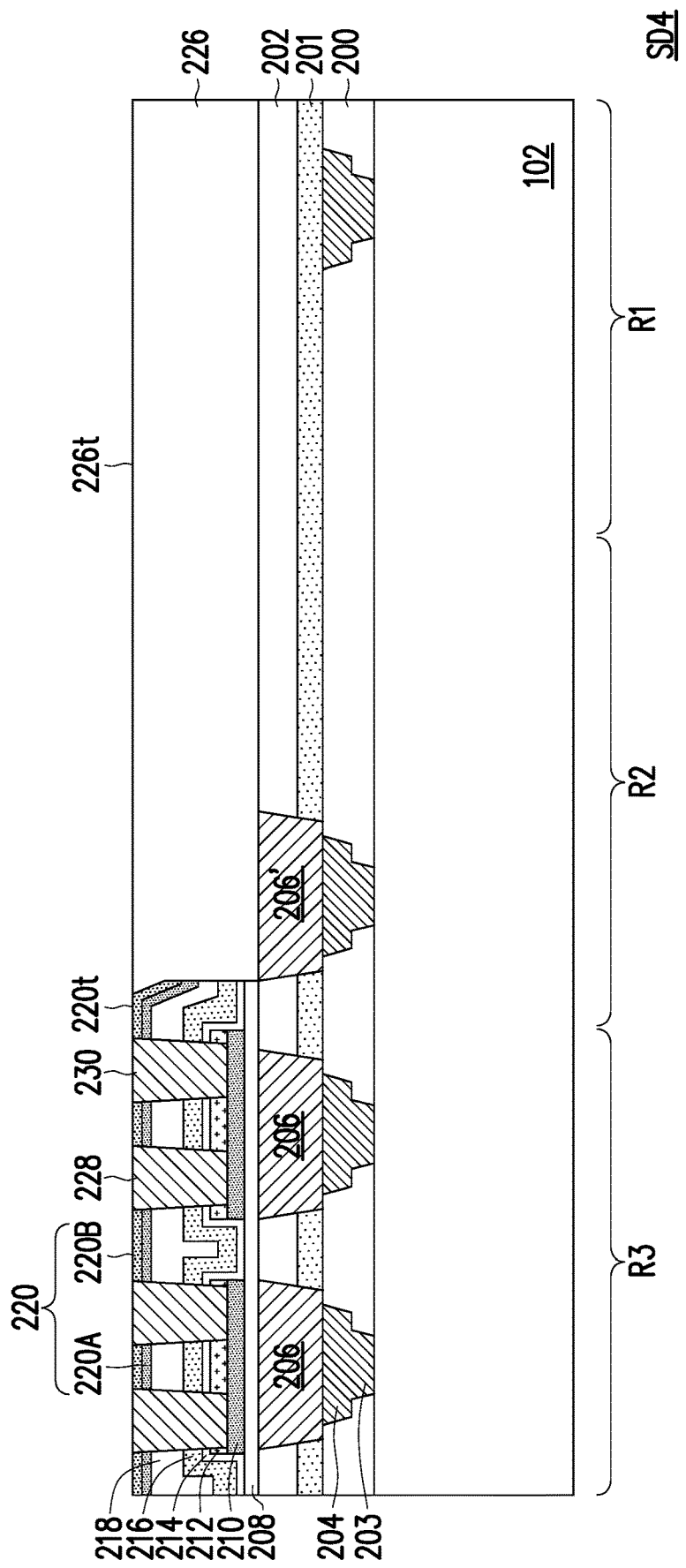
FIG. 5 is a schematic cross-sectional view of a semiconductor device in accordance with some alternative embodiments of the present disclosure.

FIG. 5 is a schematic cross-sectional view of a semiconductor device in accordance with some alternative embodiments of the present disclosure. The semiconductor device SD4 illustrated in FIG. 5 is similar to the semiconductor device SD2 illustrated in FIG. 3. Therefore, the same reference numerals are used to refer to the same or liked parts, and its detailed description will be omitted herein.

As illustrated in FIG. 5, the semiconductor device SD4 includes a stop layer 220. The stop layer 220 includes a composite material. In some embodiments, the stop layer 220 includes a first sub-stop layer 220A and a second sub-stop layer 220B in contact with each other. The first sub-stop layer 220A is in contact with the first insulating layer 218, while the second sub-stop layer 220B is in contact with dielectric layer 226. The first sub-stop layer 220A and the second sub-stop layer 220B have different materials. In alternative embodiments, the stop layer 220 may be a composite material that includes more sub-stop layers.

Figure 6:
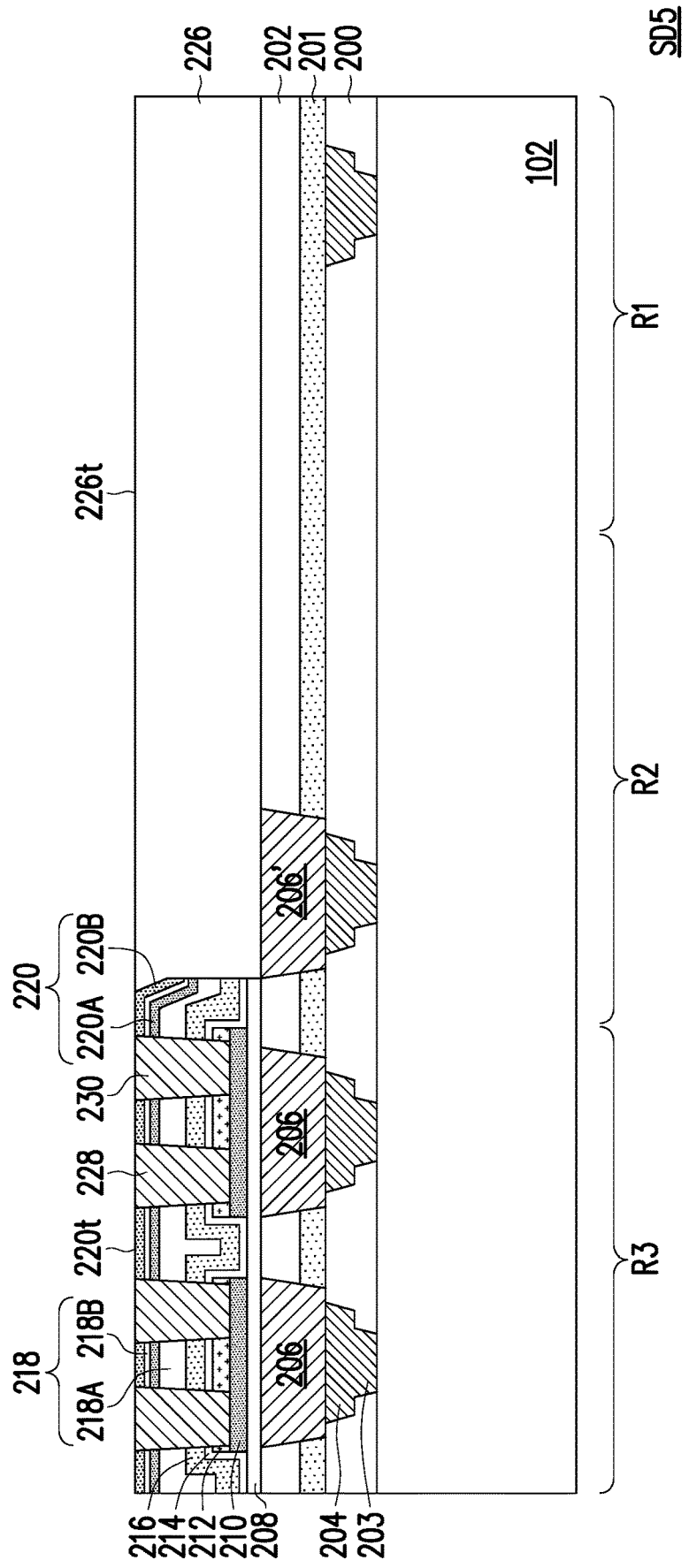
FIG. 6 is a schematic cross-sectional view of semiconductor device in accordance with some embodiments of the present disclosure.

FIG. 6 is a schematic cross-sectional view of a semiconductor device in accordance with some alternative embodiments of the present disclosure. The semiconductor device SD5 illustrated in FIG. 6 is similar to the semiconductor device SD4 illustrated in FIG. 5. Therefore, the same reference numerals are used to refer to the same or liked parts, and its detailed description will be omitted herein.

As illustrated in FIG. 6, the stop layer 220 includes a first sub-stop layer 220A and a second sub-stop layer 220B. The first insulating layer 218 includes a first sub-insulating layer 218A and a second sub-insulating layer 218B. The first sub-insulating layer 218A, the first sub-stop layer 220A, the second sub-insulating layer 218B and the second sub-stop layer 220B are formed from bottom to top. In other words, the first sub-stop layer 220A is separated from the second sub-stop layer 220B through the second sub-insulating layer 218B.

Figure 7:
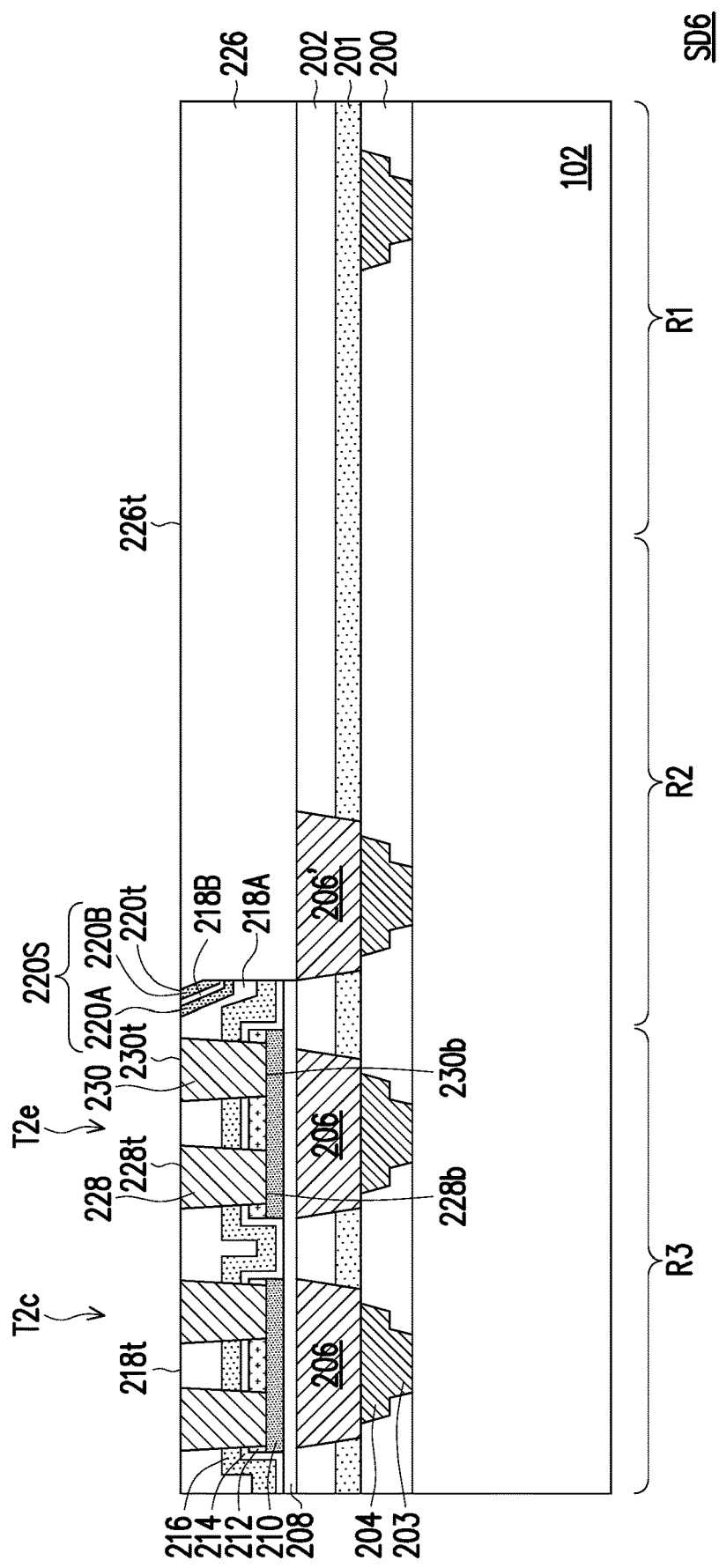
FIG. 7 is a schematic cross-sectional view of semiconductor device in accordance with some alternative embodiments of the present disclosure.

FIG. 7 is a schematic cross-sectional view of a semiconductor device in accordance with some alternative embodiments of the present disclosure. The semiconductor device SD6 illustrated in FIG. 7 is similar to the semiconductor device SD3 illustrated in FIG. 2N. Therefore, the same reference numerals are used to refer to the same or liked parts, and its detailed description will be omitted herein.

As illustrated in FIG. 7, the semiconductor device SD6 includes a stop segment 220S. The stop segment 220S includes a first sub-stop layer 220A and a second sub-stop layer 220B. The first insulating layer 218 includes a first sub-insulating layer 218A and a second sub-insulating layer 218B. The first sub-stop layer 220A is separated from the second sub-stop layer 220B through the second sub-insulating layer 218B.

Figure 8:
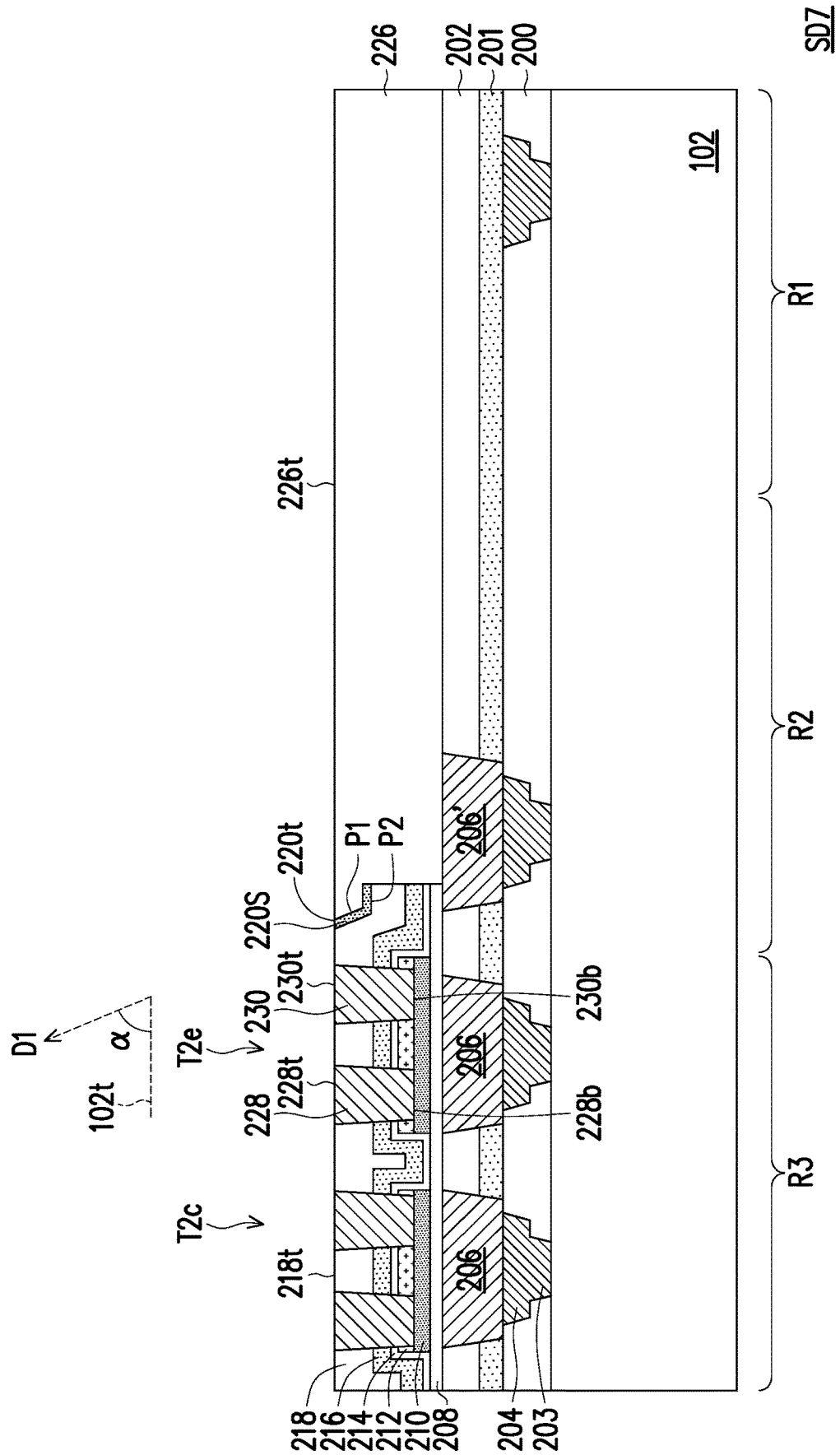
FIG. 8 is a schematic cross-sectional view of semiconductor device in accordance with some alternative embodiments of the present disclosure.

FIG. 8 is a schematic cross-sectional view of a semiconductor device in accordance with some alternative embodiments of the present disclosure. The semiconductor device SD7 illustrated in FIG. 8 is similar to the semiconductor device SD1 illustrated in FIG. 2N. Therefore, the same reference numerals are used to refer to the same or liked parts, and its detailed description will be omitted herein.

As illustrated in FIG. 8 and FIG. 2H, when the photoresist pattern 225 (shown in FIG. 2H) is formed on the insulating stack 224 in the third region R3 and extends to more of the second region R2, the semiconductor device SD7 is formed to include a stop segment 220S, and the stop segment 220S includes two parts P1 and P2 remaining in a portion of the second region R2.

Referring to FIG. 8, the stop segment 220S includes a first part P1 and a second part P2 connected each other. Both of the first part P1 and the second part P2 are located on the first insulating layer 218 in the second region R2. The first part P1 is closer to the third region R3 than the second part P2. The second part P2 is closer to the first region R1 than the first part P1. A top surface of the first part P1 is higher than a top surface of the second part P2. In some embodiments, the second part P2 overlaps with the conductive pattern 206'.

The first part P1 is located on the inclined sidewall 218cw of the first insulating layer 218. An extension direction D1 of the first part P1 forms an acute angle α with the top surface 102t of the substrate 102. The first part P1 illustrated in FIG. 8 is similar to the stop segment 220S illustrated in FIG. 2N. Therefore, the detailed description will be omitted herein. The second part P2 is substantially parallel to the top surface 102t of the substrate 102. The first part P1 is laterally sandwiched between the first insulating layer 218 and the dielectric layer 226. The second part P2 is vertically sandwiched between the dielectric layer 226 and the first insulating layer 218.

In the embodiments, since the stop layer is provided between the first insulating layer and the second insulating layer, the thickness of the first insulating layer in the central region may be control to be equal to or similar to the thickness of the first insulating layer in the edge region of the substrate. As such, the process window of the etching process for forming the first source/drain electrode and the second source/drain electrode may be improved and the reliability of the semiconductor device may be improved.

In accordance with some embodiments of the present disclosure, a method of forming a semiconductor device is described. The method includes the following steps. A gate electrode is formed within a first dielectric layer that overlies a substrate. A gate dielectric layer, a channel layer and a cap layer are formed over the gate electrode. An insulating stack is formed on the cap layer. The insulating stack includes a first insulating layer on the cap layer, a stop layer on the first insulating layer, and a second insulating layer on the stop layer. A second dielectric layer is formed on the substrate, wherein the second dielectric layer covers the insulating stack. A polarization process is performed on the second dielectric layer until the stop layer is exposed. A first source/drain electrode and a second source/drain electrode are formed in the first insulating layer and the cap layer, and connected to the channel layer.

In accordance with some other embodiments of the present disclosure, an integrated circuit includes semiconductor device includes a gate electrode, a gate dielectric layer, a channel layer, an insulating layer, a first source/drain electrode and a second source/drain electrode, a second dielectric layer, and a stop segment. The gate electrode is located within a first dielectric layer that overlies a substrate. The gate dielectric layer is located over the gate electrode. The channel layer is located on the gate dielectric layer. The insulating layer is located over the channel layer. The first source/drain electrode and the second source/drain electrode are located in the insulating layer, and connected to the channel layer. The second dielectric layer is beside one of the first source/drain electrode and the second source/drain electrode. The stop segment is embedded in the second dielectric layer.

In accordance with yet another embodiment of the present disclosure, an integrated circuit includes a substrate, an interconnection layer, a plurality of transistors, and a stop segment. The substrate includes a memory cell region, a logic region, and a connection region, wherein the connection region is connected to the memory cell region and the logic region. The interconnection layer is disposed on the substrate, wherein the interconnection layer comprises a plurality of dielectric layers and a plurality of conductive layers alternately stacked up along a build-up direction. The plurality of transistors are located between the plurality of dielectric layers in the memory cell region. The stop segment is embedded in the plurality of dielectric layers in the connection region. The stop segment is adjacent to an edge transistor of the plurality of the transistors, and the edge transistor is adjacent to the connection region. An extension direction of the stop segment forms an acute angle with a top surface of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a gate electrode within a first dielectric layer that overlies a substrate;
   a gate dielectric layer over the gate electrode;
   a channel layer on the gate dielectric layer;
   an insulating layer over the channel layer;
   a first source/drain electrode and a second source/drain electrode in the insulating layer, and connected to the channel layer;
   a second dielectric layer beside one of the first source/drain electrode and the second source/drain electrode; and
   a stop segment embedded in the second dielectric layer within a second region between a first region and a third region of the substrate,
   wherein the first region comprises a logic region, the third region comprises a memory cell region, and the second region comprises a connection region connected to the logic region and the memory cell region.

2. The semiconductor device of claim 1, wherein the stop segment comprises amorphous silicon, SiN, SiC, SiCN, SiCON or a combination thereof.

3. The semiconductor device of claim 1, wherein the stop segment is located on a inclined sidewall of the insulating layer.

4. The semiconductor device of claim 1, further comprising:
   a cap layer on the channel layer;
   an intermediate layer between the cap layer and the insulating layer; and
   a liner layer between the cap layer and the intermediate layer.

5. The semiconductor device of claim 4, wherein the intermediate layer comprises aluminum oxide, titanium oxide or a combination thereof.

6. The semiconductor device of claim 4, wherein the stop segment has a bottom higher than a top surface of the cap layer.

7. The semiconductor device of claim 1, wherein an extension direction of the stop segment forms an acute angle with a top surface of the substrate.

8. The semiconductor device of claim 1, wherein a bottom of the stop segment is between a top of the first source/drain electrode and a bottom of the first source/drain electrode.

9. An integrated circuit, comprising:
a substrate comprising a memory cell region, a logic region, and a connection region, wherein the connection region is connected to the memory cell region and the logic region;
an interconnection layer disposed on the substrate, wherein the interconnection layer comprises a plurality of dielectric layers and a plurality of conductive layers alternately stacked up along a build-up direction;
a plurality of transistors located between the plurality of dielectric layers in the memory cell region; and
a stop segment embedded in the plurality of dielectric layers in the connection region,
wherein the stop segment is adjacent to an edge transistor of the plurality of the transistors, and the edge transistor is adjacent to the connection region,
wherein an extension direction of the stop segment forms an acute angle with a top surface of the substrate.

10. The integrated circuit of claim 9, wherein the stop segment is laterally aside a source/drain electrode of the edge transistor.

11. The integrated circuit of claim 10, wherein a top surface of the stop segment is coplanar with a top surface of the source/drain electrode of the edge transistor, and a bottom of the stop segment is higher than a bottom of the source/drain electrode of the edge transistor.

12. The integrated circuit of claim 9, wherein sidewalls and the bottom of the stop segment are enclosed by the plurality of dielectric layers and a top surface of the stop segment is coplanar with a top surface of one of the plurality of dielectric layers.

13. The integrated circuit of claim 9, wherein the plurality of dielectric layers in logic region is free of the stop segment.

14. A semiconductor device, comprising:
a gate electrode within a first dielectric layer that overlies a substrate;
a gate dielectric layer over the gate electrode;
a channel layer on the gate dielectric layer;
an insulating layer over the channel layer;
a first source/drain electrode and a second source/drain electrode in the insulating layer, and connected to the channel layer;
a second dielectric layer beside one of the first source/drain electrode and the second source/drain electrode; and
a stop segment embedded in the second dielectric layer, wherein the stop segment comprises amorphous silicon, SiN, SiC, SiCN, SiCON or a combination thereof.

15. The semiconductor device of claim 14, wherein the stop segment is located on a inclined sidewall of the insulating layer.

16. The semiconductor device of claim 14, wherein the stop segment is within a second region in the substrate between a first region and a third region of the substrate.

17. The semiconductor device of claim 16, wherein the first region comprises a logic region, the third region comprises a memory cell region, and the second region comprises a connection region connected to the logic region and the memory cell region.

18. The semiconductor device of claim 14, further comprising:
a cap layer on the channel layer;
an intermediate layer between the cap layer and the insulating layer; and
a liner layer between the cap layer and the intermediate layer.

19. The semiconductor device of claim 18, wherein the intermediate layer comprises aluminum oxide, titanium oxide or a combination thereof.

20. The semiconductor device of claim 18, wherein the stop segment has a bottom higher than a top surface of the cap layer.

* * * * *